(12) United States Patent
Sakai et al.

(10) Patent No.: US 10,802,187 B2
(45) Date of Patent: Oct. 13, 2020

(54) CIRCULARLY POLARIZING PLATE, DISPLAY DEVICE, AND MULTILAYER RETARDER

(71) Applicant: SHARP KABUSHIKI KAISHA, Sakai, Osaka (JP)

(72) Inventors: Akira Sakai, Sakai (JP); Masahiro Hasegawa, Sakai (JP); Koji Murata, Sakai (JP); Yuichi Kawahira, Sakai (JP); Takako Koide, Sakai (JP); Kiyoshi Minoura, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 52 days.

(21) Appl. No.: 16/291,841

(22) Filed: Mar. 4, 2019

(65) Prior Publication Data

US 2019/0278010 A1    Sep. 12, 2019

(30) Foreign Application Priority Data

Mar. 8, 2018 (JP) ................................ 2018-041917

(51) Int. Cl.
*G02B 5/30* (2006.01)
*H01L 27/32* (2006.01)
*G02F 1/1335* (2006.01)
*G02F 1/13363* (2006.01)

(52) U.S. Cl.
CPC ......... *G02B 5/3008* (2013.01); *G02B 5/3025* (2013.01); *G02F 1/13363* (2013.01); *G02F 1/133528* (2013.01); *H01L 27/322* (2013.01); *H01L 27/3244* (2013.01); *G02F 2001/133541* (2013.01); *G02F 2001/133631* (2013.01)

(58) Field of Classification Search
CPC .. G02B 5/3008; G02B 5/3025; G02B 5/3016; G02B 5/3041; G02B 5/3083; G02B 5/3033; G02F 1/133528; G02F 1/13363; G02F 2001/133631; G02F 2001/133541; H01L 27/3244; H01L 51/5281
See application file for complete search history.

(56) References Cited

U.S. PATENT DOCUMENTS 10,180,518 B2 *  1/2019  Jeon ...................... G02B 5/3016
10,254,459 B2 *  4/2019  Hatano .................... G02B 1/08
10,564,339 B2 *  2/2020  Takahashi .................. C08J 5/18
(Continued)

FOREIGN PATENT DOCUMENTS

JP    H10-068816 A    3/1998
JP    2002-162519 A    6/2002

*Primary Examiner* — Bac H Au
(74) *Attorney, Agent, or Firm* — ScienBiziP, P.C.

(57) ABSTRACT

A circularly polarizing plate includes: a first retardation layer having negative refractive index anisotropy; a second retardation layer having positive refractive index anisotropy; and a linear polarizer, the first retardation layer and the second retardation layer being disposed such that their optical axes are parallel to each other, the first retardation layer providing an in-plane retardation whose absolute value is $|R1(\lambda)|$ to light having a wavelength of $\lambda$ nm, the second retardation layer providing an in-plane retardation whose absolute value is $|R2(\lambda)|$ to light having a wavelength of $\lambda$ nm, the first retardation layer and the second retardation layer satisfying the following formulas (1) to (4):

$|R1(450)|>|R1(550)|>|R1(650)|$     (1)

$|R2(550)|>|R1(550)|$     (2)

$|R2(550)|-|R1(550)|>|R2(450)|-|R1(450)|$     (3)

$|R2(650)|-|R1(650)|>|R2(550)|-|R1(550)|$     (4).

8 Claims, 17 Drawing Sheets

(56) References Cited

U.S. PATENT DOCUMENTS

| | | | |
|---|---|---|---|
| 2014/0168768 A1* | 6/2014 | Seo | G02B 5/3083 |
| | | | 359/489.07 |
| 2019/0107657 A1* | 4/2019 | Jung | B32B 7/12 |
| 2019/0113667 A1* | 4/2019 | Ito | C09K 19/38 |
| 2019/0310726 A1* | 10/2019 | Hashimoto | G02B 5/30 |
| 2019/0331838 A1* | 10/2019 | Konno | G02F 1/13363 |
| 2019/0353956 A1* | 11/2019 | Yanai | H01L 51/5271 |
| 2019/0353957 A1* | 11/2019 | Atsumi | H01L 51/5281 |
| 2019/0391433 A1* | 12/2019 | Hashimoto | G02F 1/13338 |

* cited by examiner

240

Isoluminance contour

Isoluminance contour

Isoluminance contour

Isoluminance contour

Isoluminance contour

Isoluminance contour

Isoluminance contour

Isoluminance contour

Isoluminance contour

Isoluminance contour

Isoluminance contour

CIRCULARLY POLARIZING PLATE, DISPLAY DEVICE, AND MULTILAYER RETARDER

CROSS-REFERENCE TO RELATED APPLICATIONS

The present application claims priority under 35 U.S.C. § 119 to Japanese Patent Application No. 2018-041917 filed on Mar. 8, 2018, the contents of which are incorporated herein by reference in their entirety.

BACKGROUND OF THE INVENTION

Field Of The Invention

The present invention relates to circularly polarizing plates, display devices, and multilayer retarders. Specifically, the present invention relates to a circularly polarizing plate and a multilayer retarder which are suitable for a display device such as an organic electroluminescent display device or a liquid crystal display device, and to a display device including the circularly polarizing plate.

Description of Related Art

There is an increasing demand for flexibilization of display devices as typified by organic electroluminescent display devices (Organic Light Emitting Diodes: OLEDs) and liquid crystal display devices (LCDs), with the aim of achieving curved displays whose display surface is curved, foldable displays, or rollable displays. In particular, expectations are high for flexibilization of OLEDs, which require no members such as a backlight and are thus structurally advantageous in terms of thickness reduction.

Some display devices include a circularly polarizing plate attached to the outside of the display panel to achieve favorable display quality and designability. For example, OLEDs, which include a cathode made of a metal, cause a significant internal reflection in the display panel. To deal with this phenomenon, OLEDs include a circularly polarizing plate having an anti-reflection effect. Reduction in thickness of the circularly polarizing plate has therefore been demanded for flexibilization. Circular polarizing plates for OLEDs or LCDs, however, are required to have wide-range functionality (to be capable of functioning as a circularly polarizing plate in a wide wavelength range) and a wide viewing angle (to be capable of functioning as a circularly polarizing plate in a wide viewing angle range). Reducing the thickness of a circularly polarizing plate while achieving both of these optical properties has been highly difficult. In other words, there is a demand for low-cost production of a circularly polarizing plate having a small thickness, wide-range functionality, and a wide viewing angle.

There are roughly two methods to provide wide-range functionality to a circularly polarizing plate. One of the methods is to stack, as shown in FIG. 22, a $\lambda/4$ plate 53 and a $\lambda/2$ plate 52 such that their optical axes cross each other, and combine this stack substantially functioning as a $\lambda/4$ plate in a wide wavelength range with a polarizing plate 51 (for example, JP H10-68816 A). This method, however, causes the apparent crossing angle of the optical axes of the $\lambda/4$ plate 53 and the $\lambda/2$ plate 52 to be different depending on the viewing azimuth, failing to achieve a wide viewing angle.

The other method is to combine, as shown in FIG. 23, a $\lambda/4$ plate (reverse wavelength dispersion $\lambda/4$ plate) 54 made of a material whose birefringence increases as the wavelength becomes longer, i.e., a reverse wavelength dispersion material, with the polarizing plate 51; here, a material containing a modified polycarbonate resin is used as the reverse wavelength dispersion material (for example, JP 2002-162519 A). This method, however, has difficulties in thinning the reverse wavelength dispersion $\lambda/4$ plate 54, which is a modified polycarbonate resin film, enough for flexibilization, failing to reduce the thickness of the circularly polarizing plate.

For reduction in thickness of a retardation layer, a method is effective which uses a coating retarder containing a polymerizable liquid crystal (reactive mesogen) in place of a retarder composed of a conventional polymer resin film. Yet, typical polymerizable liquid crystals are a material with birefringence whose absolute value is lower for longer wavelengths, i.e., a positive wavelength dispersion material, which is effective in thickness reduction but cannot achieve wide-range functionality.

BRIEF SUMMARY OF THE INVENTION

In response to these issues, an object of the present invention is to provide a circularly polarizing plate and a multilayer retarder reducible in thickness and having both wide-range functionality and a wide viewing angle, and a display device including the circularly polarizing plate.

The present inventors made various studies on methods for producing a reverse wavelength dispersion $\lambda/4$ plate reducible in thickness so as to achieve a circularly polarizing plate reducible in thickness and having both wide-range functionality and a wide viewing angle. The studies found that although it is difficult to produce a single-layer reverse wavelength dispersion $\lambda/4$ plate from a typical material by a typical process, it is possible to provide substantially the same function as a single-layer reverse wavelength dispersion $\lambda/4$ plate to a multilayer reverse wavelength dispersion $\lambda/4$ plate by stacking a first retardation layer having negative refractive index anisotropy and a second retardation layer having positive refractive index anisotropy, which have different wavelength dispersibilities, such that their optical axes are parallel to each other. The two retardation layers may be made of a positive wavelength dispersion material or any other material, so that the first retardation layer and the second retardation layer can also be coating retarders. Thereby, the present inventors successfully achieved the above object, completing the present invention.

In other words, one aspect of the present invention may be a circularly polarizing plate including: a first retardation layer having negative refractive index anisotropy; a second retardation layer having positive refractive index anisotropy; and a linear polarizer, the first retardation layer and the second retardation layer being disposed such that their optical axes are parallel to each other, the first retardation layer providing an in-plane retardation whose absolute value is $|R1(\lambda)|$ to light having a wavelength of $\lambda$ nm, the second retardation layer providing an in-plane retardation whose absolute value is $|R2(\lambda)|$ to light having a wavelength of $\lambda$ nm, the first retardation layer and the second retardation layer satisfying the following formulas (1) to (4):

$$|R1(450)| > |R1(550)| > |R1(650)| \tag{1}$$

$$|R2(550)| > |R1(550)| \tag{2}$$

$$|R2(550)| - |R1(550)| > |R2(450)| - |R1(450)| \tag{3}$$

$$|R2(650)| - |R1(650)| > |R2(550)| - |R1(550)| \tag{4}$$

Another aspect of the present invention may be a display device including a display panel, and the circularly polarizing plate disposed on a viewing surface side of the display panel.

Yet another aspect of the present invention may be a multilayer retarder including a first retardation layer having negative refractive index anisotropy, and a second retardation layer having positive refractive index anisotropy, the first retardation layer and the second retardation layer being disposed such that their optical axes are parallel to each other, the first retardation layer providing an in-plane retardation whose absolute value is $|R1(\lambda)|$ to light having a wavelength of $\lambda$ nm, the second retardation layer providing an in-plane retardation whose absolute value is $|R2(\lambda)|$ to light having a wavelength of $\lambda$ nm, the first retardation layer and the second retardation layer satisfying the following formulas (1) to (4):

$$|R1(450)|>|R1(550)|>|R1(650)| \quad (1)$$

$$|R2(550)|>|R1(550)| \quad (2)$$

$$|R2(550)|-|R1(550)|>|R2(450)|-|R1(450)| \quad (3)$$

$$|R2(650)|-|R1(650)|>|R2(550)|-|R1(550)| \quad (4).$$

The present invention can provide a circularly polarizing plate and a multilayer retarder reducible in thickness and having both wide-range functionality and a wide viewing angle, and a display device including the circularly polarizing plate.

DETAILED DESCRIPTION OF THE INVENTION

Figure 1:
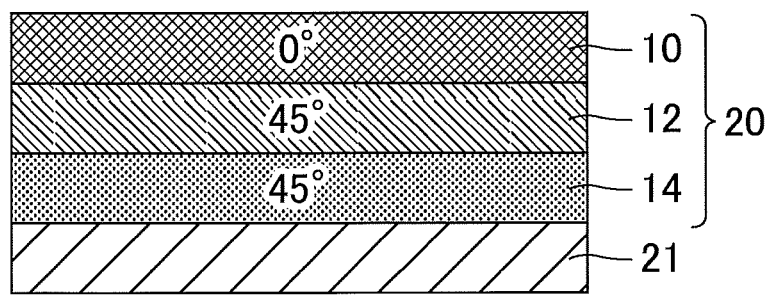
FIG. 1 is a schematic cross-sectional view showing the structure of a display device of an embodiment.

The present invention is described in more detail based on the following embodiment with reference to the drawings. The embodiment, however, is not intended to limit the scope of the present invention. The configurations of the embodiment may appropriately be combined or modified within the spirit of the present invention.

<Definition>

The "retardation layer" as used herein means a retardation layer providing an in-plane retardation of 10 nm or more to at least light having a wavelength of 550 nm. Light having a wavelength of 550 nm is light of a wavelength at which a human has the highest visual sensitivity. The in-plane retardation is defined as $R=(ns-nf) \times d$, where ns represents the in-plane principal refractive index nx or ny of the retardation layer, whichever is greater, nf represents the in-plane principal refractive index nx or ny of the retardation layer, whichever is smaller, and d represents the thickness of the retardation layer. The in-plane slow axis of a retardation layer means an axis extending in the direction corresponding to ns, and the in-plane fast axis thereof means an axis extending in the direction corresponding to nf.

The "λ/2 plate" as used herein means a retardation layer providing an in-plane retardation of ½ wavelength (275 nm) to at least light having a wavelength of 550 nm, and may be any retardation layer providing an in-plane retardation of 245 nm to 305 nm. The "λ/4 plate" means a retardation layer providing an in-plane retardation of ¼ wavelength (137.5 nm) to at least light having a wavelength of 550 nm, and may be any retardation layer providing an in-plane retardation of 107.5 nm to 167.5 nm.

The "wavelength dispersibility of a retardation layer" as used herein means the correlation between the absolute value of the retardation provided by the retardation layer and the wavelength of the incident light. In the visible light range, a retardation layer may have a "flat wavelength dispersion" property where the absolute value of the retardation provided by the retardation layer does not change in response to a change in the wavelength of incident light. Also, in the visible light range, the retardation layer may have a "normal wavelength dispersion" property where the absolute value of the retardation provided by the retardation layer decreases as the wavelength of incident light becomes longer, or a "reverse wavelength dispersion" property where the absolute value of the retardation provided by the retardation layer increases as the wavelength of incident light becomes longer.

The "positive refractive index anisotropy" as used herein means that Δn defined by the following formula is positive. A retardation layer having positive refractive index anisotropy is also called a "positive retardation layer". The "negative refractive index anisotropy" means that Δn is negative. A retardation layer having negative refractive index anisotropy is also called a "negative retardation layer".

$$\Delta n = ne - no$$

ne: extraordinary light refractive index
no: ordinary light refractive index

The "viewing surface side" as used herein means the side closer to the screen (display surface) of the display device, and the "back surface side" means the side farther from the screen (display surface) of the display device.

<Embodiment>

FIG. 1 is a schematic cross-sectional view showing the structure of a display device of an embodiment. As shown in FIG. 1, a display device of Embodiment 1 includes, from the back surface side toward the viewing surface side, a linear polarizer 10, a first retardation layer 12, a second retardation layer 14, and a display panel 21. The linear polarizer 10, the first retardation layer 12, and the second retardation layer 14 characterize the circularly polarizing plate 20. The circularly polarizing plate 20 has an anti-reflection function for light incident from the linear polarizer 10 side. An adhesive layer to bond members to each other may be provided between members as necessary.

The first retardation layer 12 and the second retardation layer 14 constitute a multilayer retarder that has the same function as a single layer reverse wavelength dispersion λ/4 plate. Herein, the in-plane retardation provided by the first retardation layer 12 to light having a wavelength of λ nm is defined as "R1(λ)" and the absolute value thereof as "|R1(λ)|", and the in-plane retardation provided by the second retardation layer to light having a wavelength of λ nm is defined as "R2(λ)" and the absolute value thereof as "|R2(λ)|".

The first retardation layer 12 and the second retardation layer 14 are disposed such that their optical axes are parallel to each other. The term "parallel" preferably means that the angle formed by the two optical axes is 0° (perfect parallel), but the angle has only to be 3° or smaller (substantially parallel). A first retardation layer having negative refractive index anisotropy has its in-plane fast axis as the optical axis, and a second retardation layer having positive refractive index anisotropy has its in-plane slow axis as the optical axis.

The first retardation layer 12 is a negative retardation layer having negative refractive index anisotropy. The first retardation layer 12 preferably provides an in-plane retardation whose absolute value is 115 to 220 nm to light having a wavelength of 550 nm.

The second retardation layer 14 is a positive retardation layer having positive refractive index anisotropy. The second retardation layer 14 preferably provides an in-plane retardation whose absolute value is 255 to 355 nm to light having a wavelength of 550 nm.

The difference in in-plane retardation between the first retardation layer 12 and the second retardation layer 14 is the retardation of the multilayer retarder. Thus, the retardation layers are preferably designed such that they provide in-plane retardations different in absolute value and wavelength dispersion and the difference in in-plane retardation is λ/4 at wavelengths in a wide visible light range. Changing the balance between the in-plane retardations of the first retardation layer 12 and the second retardation layer 14 allows adjustment of wavelength dispersion of the multilayer retarder.

In view of the above points, the first retardation layer 12 and the second retardation layer 14 are adjusted to satisfy the following conditions.

First, the first retardation layer 12 is a normal wavelength dispersion retardation layer satisfying the following formula (1).

$$|R1(450)| > |R1(550)| > |R1(650)| \tag{1}$$

The first retardation layer 12 preferably has a ratio R1(450)/R1(550) of 1.05 to 1.25, more preferably 1.10 to 1.20. The first retardation layer 12 preferably has a ratio R1(650)/R1(550) of 0.85 to 0.99, more preferably 0.90 to 0.95.

The second retardation layer 14 preferably shows smaller wavelength dispersion than the first retardation layer 12; specifically, the ratio R2(450)/R2(550) is preferably closer to 1 than the ratio R1(450)/R1(550), and the ratio R2(650)/R2(550) is preferably closer to 1 than the ratio R1(650)/R1(550). The second retardation layer 14 preferably shows a ratio R2(450)/R2(550) of 1.00 to 1.15, more preferably 1.00 to 1.10. The second retardation layer 14 preferably shows a ratio R2(650)/R2(550) of 0.85 to 1.00, more preferably 0.90 to 1.00.

Second, the first retardation layer 12 provides a retardation whose absolute value is adjusted to a smaller value than that of the second retardation layer 14, and the first retardation layer 12 and the second retardation layer 14 satisfy the following formula (2).

$$|R2(550)| > |R1(550)| \tag{2}$$

Third, the first retardation layer 12 and the second retardation layer 14 satisfy the following formulas (3) and (4).

$$|R2(550) - |R1(550)| > |R2(450)| - |R1(450)| \tag{3}$$

$$|R2(650)| - |R1(650)| > |R2(550)| - |R1(550)| \tag{4}$$

The subtraction |R2(450)|−|R1(450)| preferably equals 90 to 135 nm. The subtraction |R2(550)|−|R1(550)| preferably equals 115 to 160 nm. The subtraction |R2(650)|−|R1(650)| preferably equals 140 to 185 nm.

The first retardation layer 12 and the second retardation layer 14 can both be formed using a general material. At least one of the first retardation layer 12 or the second retardation layer 14 preferably contains a cured product of polymerizable liquid crystals. A reactive mesogen layer (coating retardation layer) containing a cured product of polymerizable liquid crystals (reactive mesogens) can be formed by, for example, coating an alignment film having been subjected to alignment treatment with polymerizable liquid crystals, and curing the liquid crystals by a method such as baking or photoirradiation. The cured products of polymerizable liquid crystals are aligned at an alignment azimuth provided by the alignment film, the azimuth set by the alignment treatment, and thereby provide retardation. Such a coating retardation layer can be advantageously made thinner than a retardation layer formed using a resin film. Common polymerizable liquid crystals are a normal wavelength dispersion material. The retardation characteristics of the first retardation layer 12 and the second retardation layer 14 can both be achieved using a normal wavelength dispersion material.

The alignment film used as the coating retardation layer can be one commonly used in the field of liquid crystal display panels, such as a polyimide film. The alignment film can be formed by coating a substrate with a solution and curing the solution by a method such as baking or photoirradiation. The alignment treatment for the alignment film can be rubbing or photoirradiation, for example.

Non-limiting preferred examples of the polymerizable liquid crystals include liquid crystalline polymers having a photoreactive group. A liquid crystalline polymer having a photoreactive group enables alignment by polarized light irradiation, for example, so that a coating retardation layer can be formed without an alignment film as a base layer. In a coating retardation layer formed using a liquid crystalline polymer having a photoreactive group, the optical axis direction in the surface of the layer can be shifted from the optical axis direction inside the layer by treatment such as rubbing, so that the coating retardation layer can also function as an alignment film. Thereby, onto the coating retardation layer formed using a liquid crystalline polymer having a photoreactive group may be directly formed another coating retardation layer without an alignment film. Forming a coating retardation layer using a liquid crystalline polymer having a photoreactive group therefore enables elimination of the alignment film, reducing the thickness and simplifying the production process.

Examples of the liquid crystalline polymer having a photoreactive group include polymers having a mesogen group such as a biphenyl group, a terphenyl group, a naphthalene group, a phenyl benzoate group, an azobenzene group, or a derivative thereof, which are often used as a mesogen component of a liquid crystalline polymer, and a photoreactive group such as a cinnamoyl group, a chalcone group, a cinnamylidene group, a β-(2-phenyl)acryloyl group, a cinnamic acid group, or a derivative thereof together in side chain(s), and a structure derived from a compound such as acrylate, methacrylate, maleimide, N-phenyl maleimide, or siloxane in the main chain.

The liquid crystalline polymer may be a homopolymer containing only a single type of repeat unit, or may be a copolymer containing two or more types of repeat units with different side chain structures. The "copolymer" includes copolymers such as alternating copolymers, random copolymers, and graft copolymers. In each copolymer, a side chain of at least one repeat unit has the mesogen group and the photoreactive group together, but a side chain of another repeat unit may contain no mesogen group or no photoreactive group.

Specific preferred examples of the liquid crystalline polymer include a copolymerizable (meth)acrylic acid polymer having a repeat unit represented by the following formula (I).

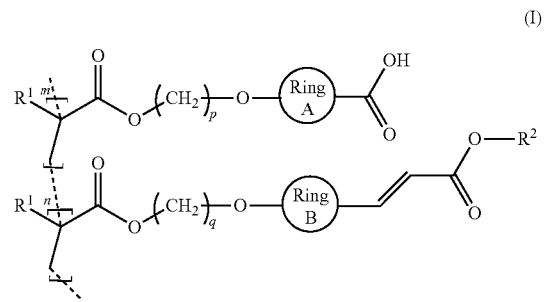

In the formula, $R^1$ is a hydrogen atom or a methyl group, $R^2$ is an alkyl group or a phenyl group substituted with a group selected from an alkyl group, an alkoxy group, a cyano group, and a halogen atom, Ring A and Ring B are each independently a group represented by any one of the following formulas (M1) to (M5), p and q are each independently an integer of 1 to 12, and m and n satisfy the relationships $0.65 \leq m \leq 0.95$, $0.05 \leq n \leq 0.35$, and $m+n=1$ and are mole fractions of the respective monomers in the copolymer.

(M1)

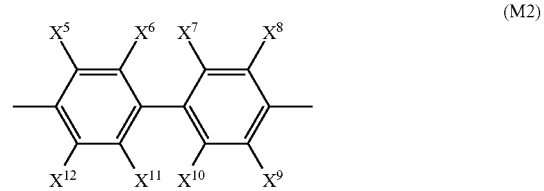

(M2)

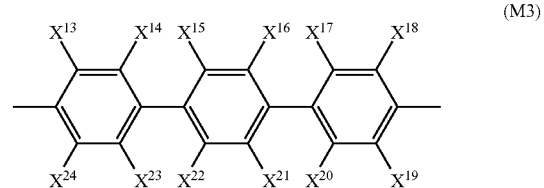

(M3)

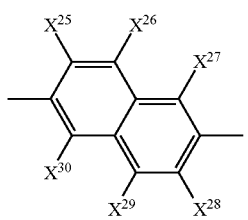
(M4)

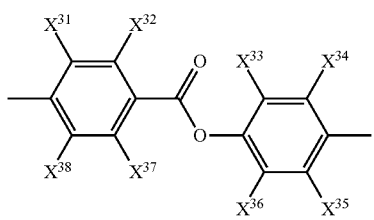
(M5)

In the formulas, $X^1$ to $X^{38}$ are each independently a hydrogen atom, an alkyl group, an alkoxy group, a halogen atom, or a cyano group.

The liquid crystalline polymer is preferably a copolymerizable (meth)acrylic acid polymer having a repeat unit represented by the following formula (I-a).

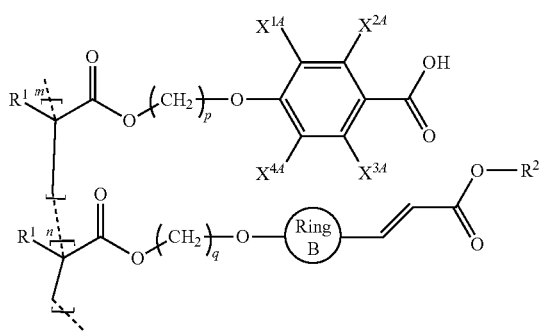
(I-a)

In the formula, $R^1$ is a hydrogen atom or a methyl group, $R^2$ is an alkyl group or a phenyl group substituted with a group selected from an alkyl group, an alkoxy group, a cyano group, and a halogen atom, $X^{1A}$ to $X^{4A}$ are each independently a hydrogen atom, an alkyl group, an alkoxy group, a halogen atom, or a cyano group, Ring B is a group represented by the following formula (M1a) or (M5a), p and q are each independently an integer of 1 to 12, and m and n satisfy the relationships $0.65 \leq m \leq 0.95$, $0.05 \leq n \leq 0.35$, and $m+n=1$ and are mole fractions of the respective monomers in the copolymer.

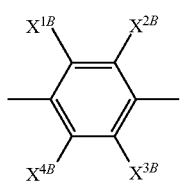
(M1a)

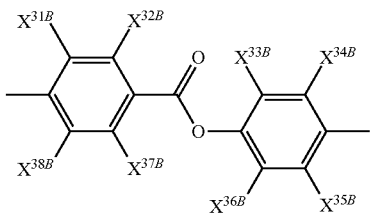
(M5a)

In the formulas, $X^{1B}$ to $X^{4B}$ and $X^{31B}$ to $X^{38B}$ are each independently a hydrogen atom, an alkyl group, an alkoxy group, a halogen atom, or a cyano group.

Also, the liquid crystalline polymer is preferably a copolymerizable (meth)acrylic acid polymer having a repeat unit represented by the following formula (I-b) or (I-c).

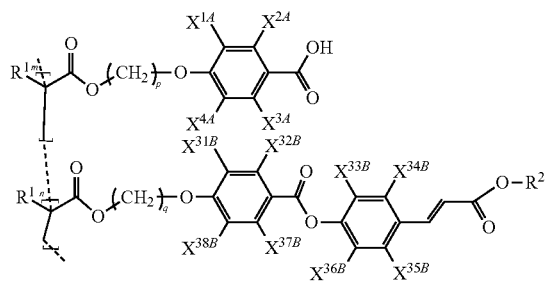
(I-b)

In the formula, $R^1$ is a hydrogen atom or a methyl group, $R^2$ is an alkyl group or a phenyl group substituted with a group selected from an alkyl group, an alkoxy group, a cyano group, and a halogen atom, $X^{1A}$ to $X^{4A}$ and $X^{31B}$ to $X^{38B}$ are each independently a hydrogen atom, an alkyl group, an alkoxy group, a halogen atom, or a cyano group, p and q are each independently an integer of 1 to 12, and m and n satisfy the relationships $0.65 \leq m \leq 0.95$, $0.05 \leq n \leq 0.35$, and $m+n=1$ and are mole fractions of the respective monomers in the copolymer.

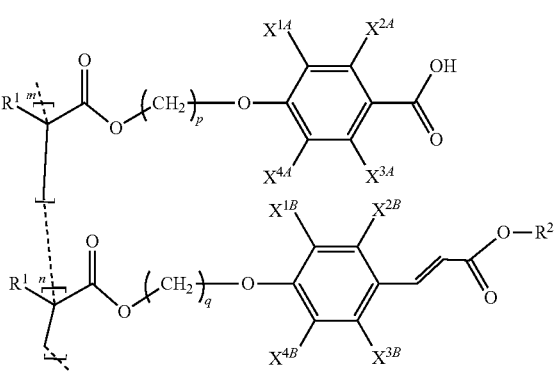
(I-c)

In the formula, $R^1$ is a hydrogen atom or a methyl group, $R^2$ is an alkyl group or a phenyl group substituted with a group selected from an alkyl group, an alkoxy group, a cyano group, and a halogen atom, $X^{1A}$ to $X^{4A}$ and $X^{1B}$ to $X^{4B}$ are each independently a hydrogen atom, an alkyl group, an alkoxy group, a halogen atom, or a cyano group, p and q are each independently an integer of 1 to 12, and m and n satisfy the relationships $0.65 \leq m \leq 0.95$, $0.05 \leq n \leq 0.35$, and $m+n=1$ and are mole fractions of the respective monomers in the copolymer.

In the formula (I) (including formula (I-a), formula (I-b), and formula (I-c); the same applies hereinafter), $R^1$ is preferably a methyl group, and $R^2$ is preferably an alkyl group or a phenyl group substituted with one group selected from an alkyl group, an alkoxy group, a cyano group, and a halogen atom, more preferably a phenyl group substituted with an alkyl group, an alkoxy group, or a cyano group, particularly preferably a phenyl group substituted with an alkyl group or an alkoxy group.

$X^{31B}$ to $X^{38B}$ are each preferably a hydrogen atom or a halogen atom, and the case is most preferred where all of $X^{31B}$ to $X^{38B}$ are hydrogen atoms.

The symbols p and q are each preferably an integer of 3 to 9, preferably an integer of 5 to 7, most preferably 6. The symbol m preferably falls within the range of $0.75 \leq m \leq 0.85$, and is most preferably 0.8. The corresponding n preferably falls within the range naturally resulting from $m+n=1$. In other words, n preferably falls within the range of $0.15 \leq n \leq 0.25$, most preferably 0.2

In the formula (I-a), (I-b), or (I-c), $X^{1A}$ to $X^{4A}$ are each preferably a hydrogen atom or a halogen atom, and cases are particularly preferred where at least one of $X^{1A}$ to $X^{4A}$ is a halogen atom and the others are hydrogen atoms or where all of $X^{1A}$ to $X^{4A}$ are hydrogen atoms. In the formula (I-b), $X^{31B}$ to $X^{38B}$ are each preferably a hydrogen atom or a halogen atom, and the case is most preferred where all of $X^{31B}$ to $X^{38B}$ are hydrogen atoms. In the formula (I-c), $X^{1B}$ to $X^{4B}$ are each preferably a hydrogen atom or a halogen atom, and the case is most preferred where all of $X^{1B}$ to $X^{4B}$ are hydrogen atoms.

The alkyl group for $R^2$ and the alkyl group as a substituent for the phenyl group for $R^2$ may each be a C1-C12 alkyl group, and are each preferably a C1-C6 alkyl group, still more preferably a C1-C4 alkyl group, most preferably a methyl group. The alkoxy group as a substituent for the phenyl group for $R^2$ may be a C1-C12 alkoxy group, and is preferably a C1-C6 alkoxy group, still more preferably a C1-C4 alkoxy group, most preferably a methoxy group. The halogen atom as a substituent for the phenyl group for $R^2$ may be a fluorine atom, a chlorine atom, a bromine atom, or an iodine atom, and is preferably a fluorine atom.

For $X^1$ to $X^{38}$, the alkyl group may be a C1-C4 alkyl group and is most preferably a methyl group; the alkoxy group may be a C1-C4 alkoxy group and is most preferably a methoxy group; and the halogen atom may be a fluorine atom, a chlorine atom, a bromine atom, or an iodine atom, and is preferably a fluorine atom.

$X^{1A}$ to $X^{38A}$ as used herein show that $X^1$ to $X^{38}$, which are substituents on Ring A or Ring B, are substituents on Ring A, and $X^{1B}$ to $X^{38B}$ show that $X^1$ to $X^{38}$ are substituents on Ring B. Thus, statements regarding $X^1$ to $X^{38}$ are applicable to $X^{1A}$ to $X^{38A}$ and $X^{1B}$ to X38B.

The liquid crystalline polymer can be dissolved in a solvent to form a retardation layer composition. To the retardation layer composition may be appropriately added a photopolymerization initiator, a surfactant, and components usually contained in a polymerizable composition causing polymerization under light or heat.

Examples of the solvent used for the retardation layer composition include toluene, ethylbenzene, ethylene glycol monomethyl ether, ethylene glycol dimethyl ether, propylene glycol methyl ether, dibutyl ether, acetone, methyl ethyl ketone, ethanol, propanol, cyclohexane, cyclopentanone, methylcyclohexane, tetrahydrofuran, dioxane, cyclohexanone, n-hexane, ethyl acetate, butyl acetate, propylene glycol methyl ether acetate, methoxybutyl acetate, N-methylpyrrolidone, and dimethylacetamide. Preferred among these are methyl ethyl ketone and cyclohexanone in terms of toxicity, environmental load, and/or solubility resistance against a resin for the substrate (e.g., polyethylene terephthalate (PET), cycloolefin polymer (COP)). These may be used alone or in combination with each other. Especially the polymer having a repeat unit represented by the formula (I) has an excellent feature that it can dissolve in methyl ethyl ketone and cyclohexanone.

The photopolymerization initiator can be any known general photopolymerization initiator used to form a uniform film by application of a small amount of light. Specific examples thereof include azonitrile-based photopolymerization initiators such as 2,2'-azobisisobutyronitrile and 2,2'-azobis(2,4-dimethylvaleronitrile); α-amino ketone-based photopolymerization initiators such as IRGACURE 907 (Ciba Specialty Chemicals Inc.) and IRGACURE 369 (Ciba Specialty Chemicals Inc.); acetophenone-based photopolymerization initiators such as 4-phenoxydichloroacetophenone, 4-t-butyl-dichloroacetophenone, diethoxyacetophenone, 1-(4-isopropylphenyl)-2-hydroxy-2-methylpropan-1-one, 1-hydroxycyclohexylphenylketone, and 2-benzyl-2-dimethylamino-1-(4-morpholinophenyl)-butan-1-one;

benzoin-based photopolymerization initiators such as benzoin, benzoin methyl ether, benzoin ethyl ether, benzoin isopropyl ether, and benzyl dimethyl ketal; benzophenone-based photopolymerization initiators such as benzophenone, benzoylbenzoic acid, methyl benzoyl benzoate, 4-phenylbenzophenone, hydroxybenzophenone, acrylated benzophenone, and 4-benzoyl-4'-methyldiphenyl sulfide; thioxanthone-based photopolymerization initiators such as 2-chlorothioxanthone, 2-methylthioxanthone, isopropylthioxanthone, and 2,4-diisopropylthioxanthone; triazine-based photopolymerization initiators such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphtho-1-yl)-4,6-bis(trichloromethyl)-s-triazine, 2-(4-methoxy-naphtho-1-yl)-4,6-bis(trichloromethyl)-s-triazine, 2,4-trichloromethyl-(piperonyl)-6-triazine, and 2,4-trichloromethyl(4'-methoxystyryl)-6-triazine; carbazole-based photopolymerization initiators; imidazole-based photopolymerization initiators; and photopolymerization initiators such as α-acyloxy ester, acylphosphine oxide, methyl phenylglyoxylate, benzyl, 9,10-phenanthrenequinone, camphorquinone, ethylanthraquinone, 4,4'-diethyl isophthalophenone, 3,3',4,4'-tetra(t-butylperoxycarbonyl) benzophenone, 4,4'-diethylaminobenzophenone, and thioxanthone. The photopolymerization initiators may be used alone or in combination with each other.

The surfactant can be any surfactant generally used to form a uniform film. Specific examples thereof include anionic surfactants such as sodium lauryl sulfate, ammonium lauryl sulfate, triethanolamine lauryl sulfate, polyoxyethylene alkyl ether sulfate, alkyl ether phosphate, sodium oleyl succinate, potassium myristate, potassium cocoate, and sodium lauroyl sarcosinate; nonionic surfactants such as polyethylene glycol monolaurate, sorbitan stearate, glycerol myristate, glycerol dioleate, and sorbitan oleate; cationic surfactants such as stearyltrimethylammonium chloride, behenyltrimethylammonium chloride, stearyldimethylbenzylammonium chloride, and cetyltrimethylammonium chloride; amphoteric surfactants such as alkyl betaines including lauryl betaine, alkyl sulfobetaine, cocamidopropyl betaine, and alkyldimethylaminoacetic acid betaine, alkyl imidazoline, and sodium cocoamphoacetate; and surfactants such as BYK-361, BYK-306, BYK-307 (BYK Japan KK), Fluorad FC430 (Sumitomo 3M Limited), and Megaface F171 and R08 (DIC Corporation). These surfactants may be used alone or in combination with each other.

In the case of forming the first retardation layer 12 and the second retardation layer 14 using polymerizable liquid crystals, an alignment film and a polymerizable liquid crystal layer are formed on a substrate, and then both of them may be removed from the substrate and transferred to the linear polarizer 10, or the alignment film may be left on the substrate and the polymerizable liquid crystal layer alone may be transferred to the linear polarizer 10. Also, the alignment film and the polymerizable liquid crystal layer may be sequentially formed on the linear polarizer 10, or the alignment film and the polymerizable liquid crystal layer may be sequentially formed on the display panel 21.

The linear polarizer 10 can be, for example, a polarizer (absorptive polarizing plate) obtained by dyeing a polyvinyl alcohol (PVA) film with an anisotropic material such as an iodine complex (or a dye) to adsorb the material on the PVA film and stretch-aligning the material. Typically, in order to achieve a mechanical strength and moist heat resistance, each surface of the PVA film is laminated with a protective film such as a triacetyl cellulose (TAC) film for practical use. Herein, the "linear polarizer" is also referred to as a "polarizing plate".

The linear polarizer 10 may be a coating polarization layer containing a cured product of polymerizable liquid crystals, particularly one including an alignment film subjected to alignment treatment in a specific azimuth and a reactive mesogen layer containing a material causing a dichroic dye oriented to the azimuth, for example, to exhibit the polarization performance. The alignment film used for the coating polarization layer can be formed as with the alignment film used for the coating retardation layer. The reactive mesogen layer in the coating polarization layer can be formed as with the reactive mesogen layer in the coating λ/4 retardation layer, except that a dichroic material exhibiting polarization performance, such as a dichroic dye, is contained. The linear polarizer 10 may be a coating polarization layer formed by applying shearing stress to a material containing a lyotropic liquid crystalline dye, and thereby aligning molecules of the dye.

The display panel 21 may be of any type and may be, for example, an organic electroluminescent panel or a liquid crystal panel. In other words, the display device of the present embodiment may be an organic electroluminescent display device including a circularly polarizing plate or a liquid crystal display device including a circularly polarizing plate.

The display device of the present embodiment includes the circularly polarizing plate 20, which reduces internal reflection of the display panel 21. The display device therefore reduces reflection (glare) of external light, significantly enhancing the visibility of the display panel 21 in outside use. Owing particularly to the circularly polarizing plate 20 having wide-range functionality and a wide viewing angle, the display device can provide favorable black display with a wide viewing angle while reducing coloring of the screen of the display panel 21.

The present invention is described in more detail below based on examples and comparative examples. The examples, however, are not intended to limit the scope of the present invention.

EXAMPLE 1

Figure 2A:
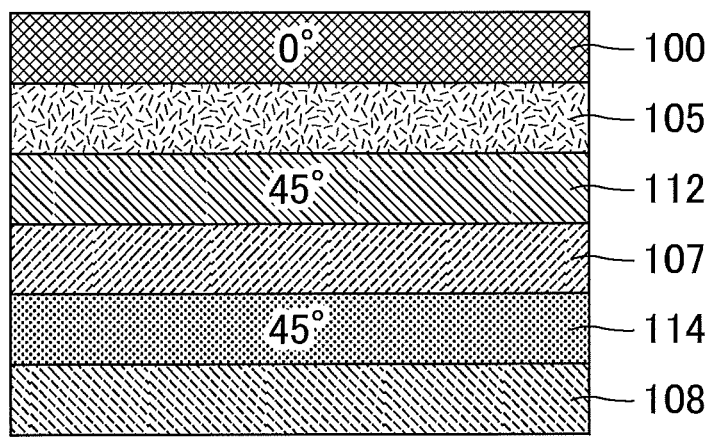
FIG. 2A is a schematic cross-sectional view showing the structure of a circularly polarizing plate of Example 1.
Figure 2B:
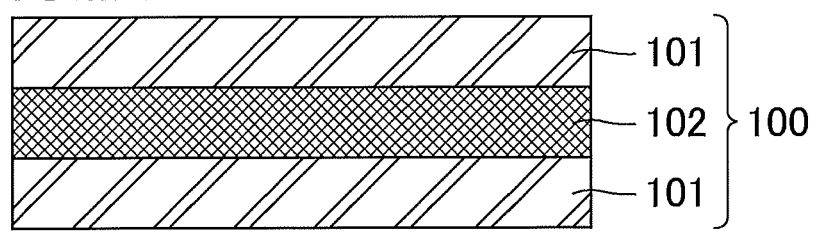
FIG. 2B is a schematic cross-sectional view showing the structure of a polarizing plate in the circularly polarizing plate of Example 1.

FIG. 2A is a schematic cross-sectional view showing the structure of a circularly polarizing plate of Example 1, and FIG. 2B is a schematic cross-sectional view showing the structure of a polarizing plate in the circularly polarizing plate of Example 1. A circularly polarizing plate 110 of Example 1 includes a stack of a polarizing plate 100 having a thickness of 65 μm, an adhesive 105 having a thickness of 12 μm, a retardation layer (A) 112 having a thickness of 1 μm, an alignment film 107 having a thickness of 0.1 μm, a retardation layer (B) 114 having a thickness of 2 μm, and an alignment film 108 having a thickness of 0.1 μm. The circularly polarizing plate of Example 1 has a thickness of 80 μm.

The polarizing plate 100 includes a stack of a protective film (TAC film) 101 having a thickness of 25 μm, an iodine-impregnated PVA film (polyvinyl alcohol film impregnated with iodine) 102 having a thickness of 15 μm, and a protective film 101 having a thickness of 25 μm.

The optical characteristics of the circularly polarizing plate of Example 1 depend on the polarizing plate 100, the retardation layer (A) 112, and the retardation layer (B) 114. The retardation layer (A) 112 is a negative λ/4 plate showing normal wavelength dispersion. The retardation layer (B) 114 is a positive λ/2 plate showing normal wavelength dispersion. The retardation characteristics of the retardation layer (A) 112 and the retardation layer (B) 114 are shown in detail in the following Table 1. The optical axis of the retardation layer (A) 112 and the optical axis of the retardation layer (B) 114 are parallel to each other and are each at an azimuth of 45°, with the position of the optical axis of the polarizing plate 100 being defined as an azimuth of 0°. A retardation layer having positive refractive index anisotropy has its slow axis as the optical axis. A retardation layer having negative refractive index anisotropy has its fast axis as the optical axis. The retardation layer (A) 112 and the retardation layer (B) 114 in combination give a λ/4 plate having a wide viewing angle and showing reverse wavelength dispersion.

The retardation layer (A) 112 and the retardation layer (B) 114 can each be formed using polymerizable liquid crystals. The circularly polarizing plate of Example 1 can be produced by the following procedure.
(Step 1)
The alignment film 108 is formed by applying an alignment film composition having photoalignability to a PET film and irradiating the composition with polarized UV light for photoalignment treatment.
(Step 2)
The retardation layer (B) 114 is formed by applying polymerizable liquid crystals to the alignment film 108 and then curing the liquid crystals.
(Step 3)
The alignment film 107 is formed by applying an alignment film composition having photoalignability to the retardation layer (B) 114 and irradiating the composition with polarized UV light for photoalignment treatment.
(Step 4)
The retardation layer (A) 112 is formed by applying polymerizable liquid crystals to the alignment film 108 and curing the liquid crystals. Thereby, the multilayer retarder is completed which includes a stack of the retardation layer (A) 112, the alignment film 107, the retardation layer (B) 114, and the alignment film 108 on the PET film.
(Step 5)
The multilayer retarder is transferred to the polarizing plate 100 by bonding the retardation layer (A) 112 to the polarizing plate 100 via the adhesive 105 and peeling off the PET film.

EXAMPLES 2 to 4

The circularly polarizing plates of Examples 2 to 4 are the same as the circularly polarizing plate of Example 1, except that the retardation values of the retardation layer (A) 112 and the retardation layer (B) 114 are changed as shown in the following Table 1. The reverse wavelength dispersion performance can be adjusted by changing the retardation values of the retardation layer (A) 112 and the retardation layer (B) 114.

EXAMPLE 5

Figure 3:
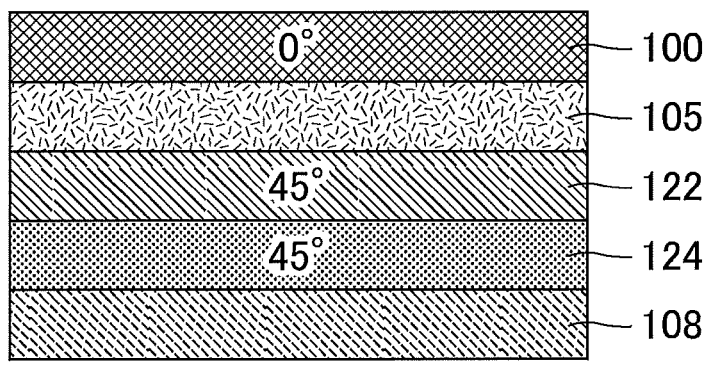
FIG. 3 is a schematic cross-sectional view showing the structure of a circularly polarizing plate of Example 5.

FIG. 3 is a schematic cross-sectional view showing the structure of a circularly polarizing plate of Example 5. A circularly polarizing plate 120 of Example 5 includes a stack of the polarizing plate 100 having a thickness of 65 μm, the adhesive 105 having a thickness of 12 μm, a retardation layer (A) 122 having a thickness of 1 μm, a retardation layer (B) 124 having a thickness of 2 μm, and the alignment film 108 having a thickness of 0.1 μm. The circularly polarizing plate of Example 5 has a thickness of 80 μm.

The optical characteristics of the circularly polarizing plate of Example 5 depend on the polarizing plate 100, the retardation layer (A) 122, and the retardation layer (B) 124. The retardation layer (A) 122 is a negative λ/4 plate showing normal wavelength dispersion. The retardation layer (B) 124 is a positive λ/2 plate showing normal wavelength dispersion. The retardation characteristics of the retardation layer (A) 122 and the retardation layer (B) 124 are shown in detail in the following Table 1. The optical axis of the retardation layer (A) 122 and the optical axis of the retardation layer (B) 124 are parallel to each other and are each at an azimuth of 45°. The optical axis of the retardation layer (A) 122 and the optical axis of the retardation layer (B) 124 in combination give a λ/4 plate having a wide viewing angle and showing reverse wavelength dispersion.

The retardation layer (A) 122 can be formed using polymerizable liquid crystals having a photoreactive group, and the retardation layer (B) 124 can be formed using polymerizable liquid crystals. The circularly polarizing plate of Example 5 can be produced by the following procedure.
(Step 1)
The alignment film 108 is formed by applying an alignment film composition having photoalignability to a PET film and irradiating the composition with polarized UV light for photoalignment treatment.
(Step 2)
The retardation layer (B) 124 is formed by applying polymerizable liquid crystals to the alignment film 108 and then curing the liquid crystals.
(Step 3)
Polymerizable liquid crystals having a photoreactive group used to form the retardation layer (A) 122 are applied to the retardation layer (B) 124. Specifically, a composition having a solids concentration of a liquid crystalline polymer of 10 wt % can be used which is obtained by dissolving a liquid crystalline polymer having a structure similar to the liquid crystalline polymer disclosed in JP 2015-172756 A in a mixed solvent of N-methylpyrrolidone (NMP) and butyl cellosolve (BCS). The composition is applied to the retardation layer (B) 124 at 500 rpm by spin coating, followed by air-drying for about five seconds. The composition is then pre-baked on a hot plate at 60° C. for five minutes, and then irradiated with linearly polarized ultraviolet light having a center wavelength of 365 nm with an intensity of 0.1 J. The composition is further post-baked on the hot plate at 120° C. for 30 minutes. Thereby, the retardation layer (A) 122 is formed. Here, the multilayer retarder is completed which includes a stack of the retardation layer (A) 122, the retardation layer (B) 124, and the alignment film 108 on the PET film.
(Step 4)
The multilayer retarder is transferred to the polarizing plate 100 by bonding the retardation layer (A) 122 to the polarizing plate 100 via the adhesive 105 and peeling off the PET film.

EXAMPLE 6

Figure 4:
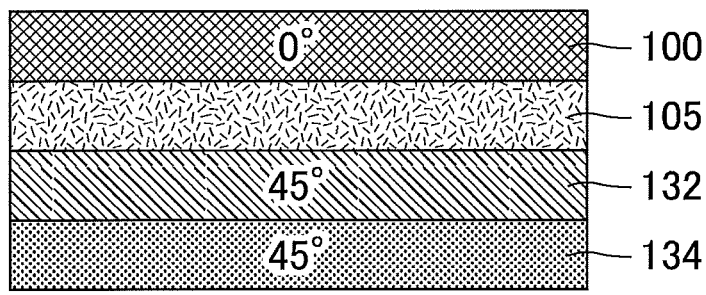
FIG. 4 is a schematic cross-sectional view showing the structure of a circularly polarizing plate of Example 6.

FIG. 4 is a schematic cross-sectional view showing the structure of a circularly polarizing plate of Example 6. A circularly polarizing plate 130 of Example 6 includes a stack of the polarizing plate 100 having a thickness of 65 μm, the adhesive 105 having a thickness of 12 μm, a retardation layer (A) 132 having a thickness of 2 μm, and a retardation layer (B) 134 having a thickness of 1 μm. The circularly polarizing plate of Example 6 has a thickness of 80 μm.

The optical characteristics of the circularly polarizing plate of Example 6 depend on the polarizing plate 100, the retardation layer (A) 132, and the retardation layer (B) 134. The retardation layer (A) 132 is a positive λ/2 plate showing normal wavelength dispersion. The retardation layer (B) 134 is a negative λ/4 plate showing normal wavelength dispersion. The retardation characteristics of the retardation layer (A) 132 and the retardation layer (B) 134 are shown in detail in the following Table 1. The optical axis of the retardation layer (A) 132 and the optical axis of the retardation layer (B) 134 are parallel to each other and are each at an azimuth of 45°. The optical axis of the retardation layer (A) 132 and the optical axis of the retardation layer (B) 134 in combination give a λ/4 plate having a wide viewing angle and showing reverse wavelength dispersion.

The retardation layer (A) 132 can be formed using polymerizable liquid crystals, and the retardation layer (B) 134 can be formed using polymerizable liquid crystals having a photoreactive group. The polymerizable liquid crystals having a photoreactive group used in Example 6 are the same as those used for the retardation layer (A) 122 in Example 5. Yet, the polymerizable liquid crystals having a photoreactive group can exhibit alignment performance upon rubbing, without changing the direction of the optical axis inside the retardation layer. The circularly polarizing plate of Example 6 excludes the alignment film by reversing the stacking order for the circularly polarizing plate of Example 5, and can be formed by the following procedure.
(Step 1)
The retardation layer (B) 134 is formed on a PET film using the same material by the same method as with the retardation layer (A) 122 in Example 5. The surface of the retardation layer (B) 134 is then rubbed.
(Step 2)
The retardation layer (A) 132 is formed by applying polymerizable liquid crystals to the retardation layer (B) 134 and then curing the liquid crystals. Thereby, the multilayer retarder is completed which includes a stack of the retardation layer (B) 134 and the retardation layer (A) 132 on the PET film.

(Step 3)

The multilayer retarder is transferred to the polarizing plate 100 by bonding the retardation layer (A) 132 to the polarizing plate 100 via the adhesive 105 and peeling off the PET film.

EXAMPLE 7

Figure 5:
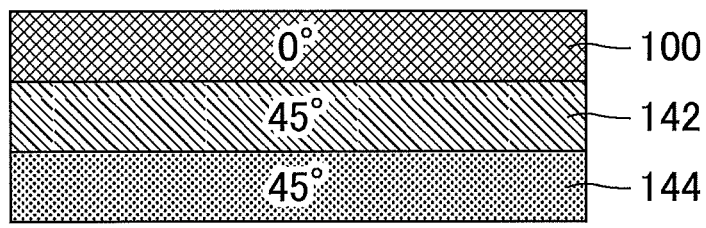
FIG. 5 is a schematic cross-sectional view showing the structure of a circularly polarizing plate of Example 7.

FIG. 5 is a schematic cross-sectional view showing the structure of a circularly polarizing plate of Example 7. A circularly polarizing plate 140 of Example 7 includes a stack of the polarizing plate 100 having a thickness of 65 µm, a retardation layer (A) 142 having a thickness of 1 µm, and a retardation layer (B) 144 having a thickness of 2 µm. The circularly polarizing plate of Example 7 has a thickness of 68 µm.

The retardation layer (A) 142 is a negative λ/4 plate showing normal wavelength dispersion. The retardation layer (B) 144 is a positive λ/2 plate showing normal wavelength dispersion. The retardation characteristics of the retardation layer (A) 142 and the retardation layer (B) 144 are shown in detail in the following Table 1. The optical axis of the retardation layer (A) 142 and the optical axis of the retardation layer (B) 144 are parallel to each other and are each at an azimuth of 45°. The optical axis of the retardation layer (A) 142 and the optical axis of the retardation layer (B) 144 in combination give a λ/4 plate having a wide viewing angle and showing reverse wavelength dispersion.

The retardation layer (A) 142 can be formed using polymerizable liquid crystals having a photoreactive group, and the retardation layer (B) 144 can be formed using polymerizable liquid crystals. The method for producing the circularly polarizing plate of Example 7 is different from the method for producing the circularly polarizing plate of Example 6 in that the multilayer retarder is not one formed on the PET film and then transferred to the polarizing plate, but is one directly formed on the polarizing plate 100 in the first place.

COMPARATIVE EXAMPLE 1

Figure 6:
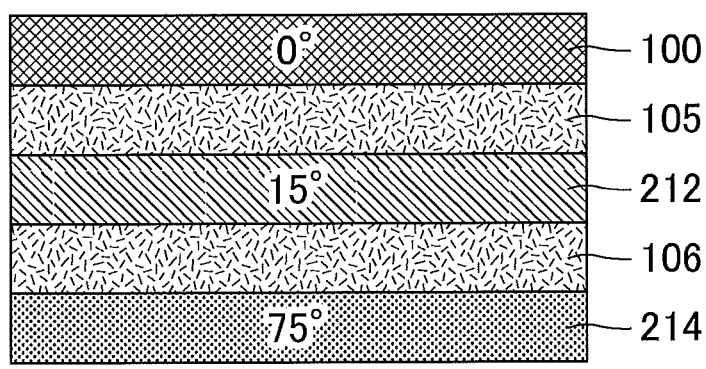
FIG. 6 is a schematic cross-sectional view showing the structure of a circularly polarizing plate of Comparative Example 1.

FIG. 6 is a schematic cross-sectional view showing the structure of a circularly polarizing plate of Comparative Example 1. A circularly polarizing plate 210 of Comparative Example 1 includes a stack of the polarizing plate 100 having a thickness of 65 µm, the adhesive 105 having a thickness of 12 µm, a retardation layer (A) 212 having a thickness of 50 µm, an adhesive 106 having a thickness of 12 µm, and a retardation layer (B) 214 having a thickness of 35 µm. The circularly polarizing plate of Comparative Example 1 has a thickness of 174 µm.

The retardation layer (A) 212 is a positive λ/2 plate showing normal wavelength dispersion. The retardation layer (B) 214 is a positive λ/4 plate showing normal wavelength dispersion. The retardation characteristics of the retardation layer (A) 212 and the retardation layer (B) 214 are shown in detail in the following Table 1. The optical axis of the retardation layer (A) 212 is at an azimuth of 15° and the optical axis of the retardation layer (B) 214 is at an azimuth of 75°. The optical axis of the retardation layer (A) 212 and the optical axis of the retardation layer (B) 214 in combination give a λ/4 plate showing reverse wavelength dispersion but having a narrow viewing angle.

Both the retardation layer (A) 212 and the retardation layer (B) 214 are stretched films of general polycarbonate (PC) used as retardation films.

COMPARATIVE EXAMPLE 2

Figure 7:
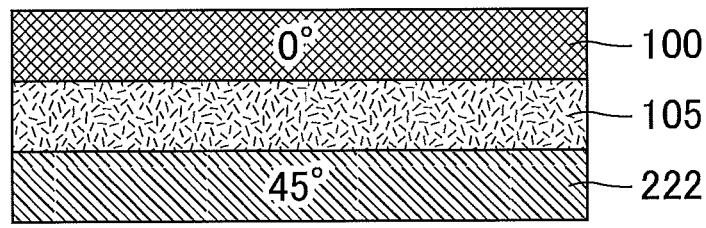
FIG. 7 is a schematic cross-sectional view showing the structure of a circularly polarizing plate of Comparative Example 2.

FIG. 7 is a schematic cross-sectional view showing the structure of a circularly polarizing plate of Comparative Example 2. A circularly polarizing plate 220 of Comparative Example 2 includes a stack of the polarizing plate 100 having a thickness of 65 µm, the adhesive 105 having a thickness of 12 µm, and a retardation layer (A) 222 having a thickness of 45 µm. The circularly polarizing plate of Comparative Example 2 has a thickness of 122 µm.

The retardation layer (A) 222 is a positive λ/4 plate showing reverse wavelength dispersion. The retardation characteristics of the retardation layer (A) 222 are shown in detail in the following Table 1. The optical axis of the retardation layer (A) 222 is at an azimuth of 45°. The retardation layer (A) 222 is a λ/4 plate having a wide viewing angle and showing reverse wavelength dispersion. Yet, the layer can be produced only using a modified product of polycarbonate (reverse dispersion modified PC) modified to show reverse wavelength dispersion, thereby being unfortunately expensive and difficult to reduce in thickness.

COMPARATIVE EXAMPLE 3

Figure 8:
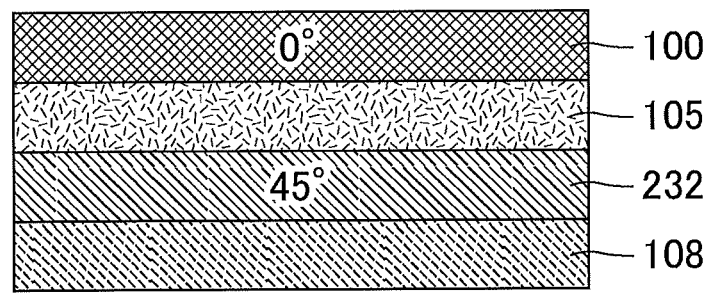
FIG. 8 is a schematic cross-sectional view showing the structure of a circularly polarizing plate of Comparative Example 3.

FIG. 8 is a schematic cross-sectional view showing the structure of a circularly polarizing plate of Comparative Example 3. A circularly polarizing plate 230 of Comparative Example 3 includes a stack of the polarizing plate 100 having a thickness of 65 µm, the adhesive 105 having a thickness of 12 µm, a retardation layer (A) 232 having a thickness of 1 µm, and the alignment film 108 having a thickness of 0.1 pm. The circularly polarizing plate of Comparative Example 3 has a thickness of 78 µm.

The retardation layer (A) 232 is a positive λ/4 plate showing normal wavelength dispersion. The retardation characteristics of the retardation layer (A) 232 are shown in detail in the following Table 1. The optical axis of the retardation layer (A) 232 is at an azimuth of 45°. The retardation layer (A) 232, showing normal wavelength dispersion, cannot exhibit its performance as a λ/4 plate in a wide range. The retardation layer (A) 232 can be formed using polymerizable liquid crystals.

COMPARATIVE EXAMPLE 4

Figure 9:
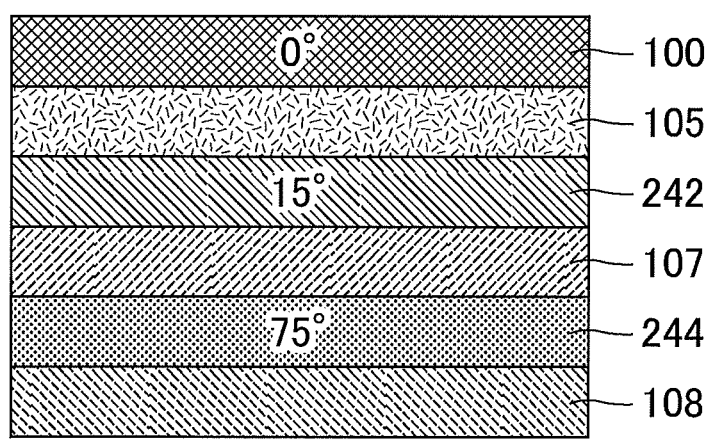
FIG. 9 is a schematic cross-sectional view showing the structure of a circularly polarizing plate of Comparative Example 4.

FIG. 9 is a schematic cross-sectional view showing the structure of a circularly polarizing plate of Comparative Example 4. A circularly polarizing plate 240 of Comparative Example 4 includes a stack of the polarizing plate 100 having a thickness of 65 µm, the adhesive 105 having a thickness of 12 µm, a retardation layer (A) 242 having a thickness of 2 µm, the alignment film 107 having a thickness of 0.1 µm, a retardation layer (B) 244 having a thickness of 1 µm, and the alignment film 108 having a thickness of 0.1 µm. The circularly polarizing plate of Comparative Example 4 has a thickness of 80 µm.

The retardation layer (A) 242 is a positive λ/2 plate showing normal wavelength dispersion. The retardation layer (B) 244 is a positive λ/4 plate showing normal wavelength dispersion. The retardation characteristics of the retardation layer (A) 242 and the retardation layer (B) 244 are shown in detail in the following Table 1. The optical axis of the retardation layer (A) 242 is at an azimuth of 15° and the optical axis of the retardation layer (B) 244 is at an azimuth of 75°. The optical axis of the retardation layer (A) 242 and the optical axis of the retardation layer (B) 244 in combination give a λ/4 plate showing reverse wavelength dispersion but having a narrow viewing angle.

The retardation layer (A) 242 and the retardation layer (B) 244 are both formed using polymerizable liquid crystals. Hence, the circularly polarizing plate of Comparative Example 4 can be produced by the same method as that for the circularly polarizing plate of Example 1. The circularly polarizing plate of Comparative Example 4 includes two retardation layers having the same characteristics as the circularly polarizing plate of Comparative Example 1 and formed using polymerizable liquid crystals, but is structurally different from the circularly polarizing plate of Comparative Example 1 in that the two alignment films 107 and 108 are used to control the alignment of polymerizable liquid crystals.

was disregarded in the calculations. The calculation results are shown in FIGS. 10 to 21.

Figure 18A:
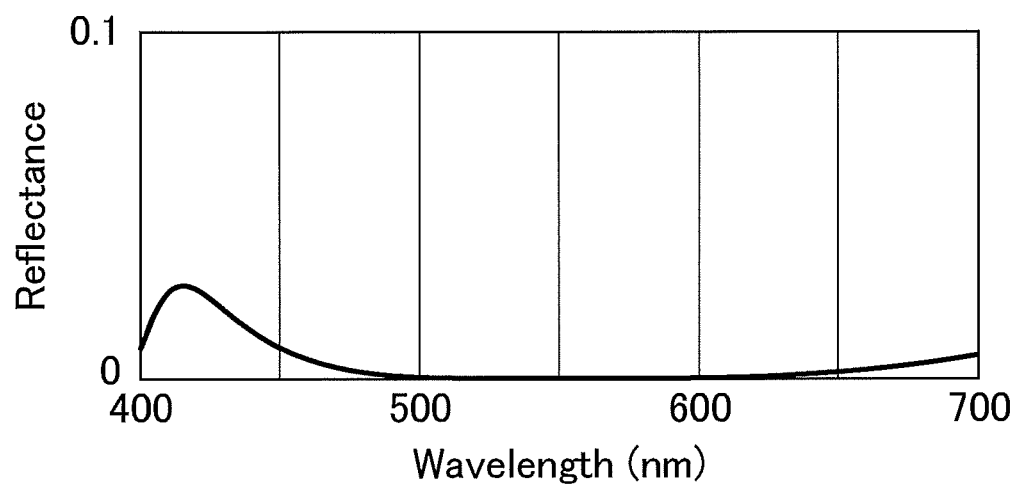
FIG. 18A is a graph showing the reflection spectrum of the circularly polarizing plate of Comparative Example 1.
Figure 18B:
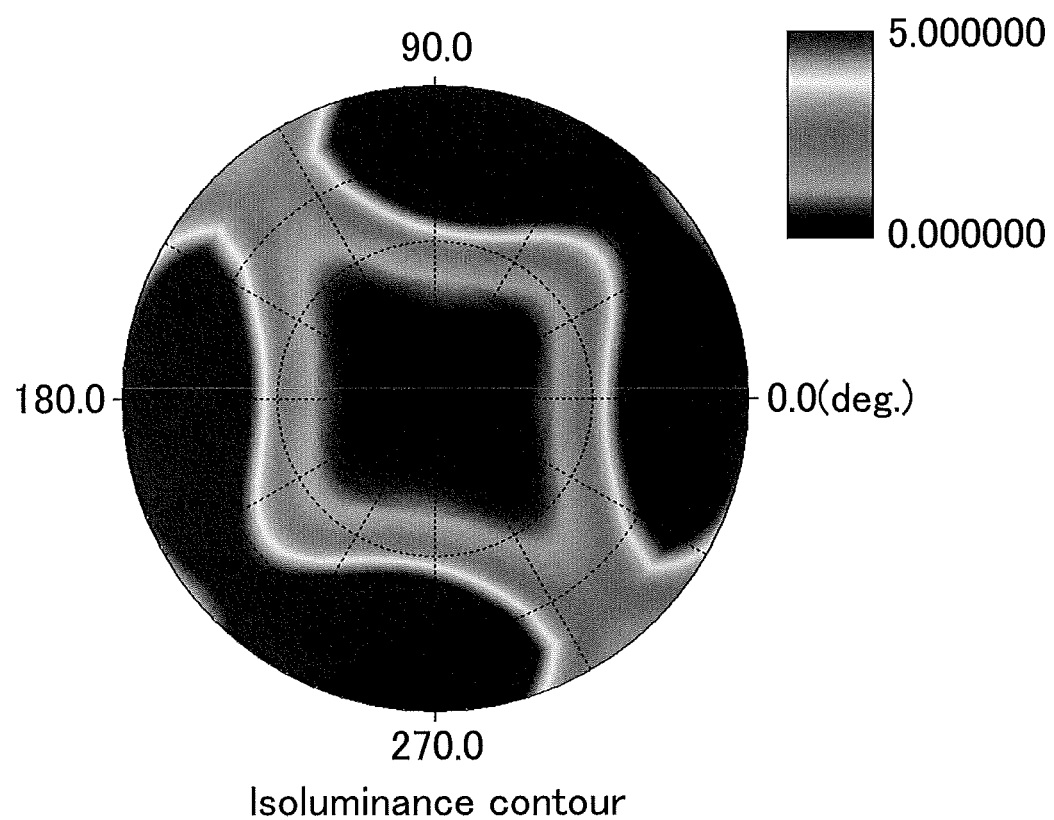
FIG. 18B is an isoluminance contour showing the reflection viewing angle of the circularly polarizing plate of Comparative Example 1.

The circularly polarizing plate of Comparative Example 1 has a thickness as great as 174 μm as shown in Table 1. Also, the reflection spectrum in FIG. 18A shows that the circularly polarizing plate exhibits the anti-reflection function in a wide range, while the isoluminance contour showing the reflection viewing angle in FIG. 18B shows that the circularly polarizing plate has a narrow viewing angle.

Figure 19A:
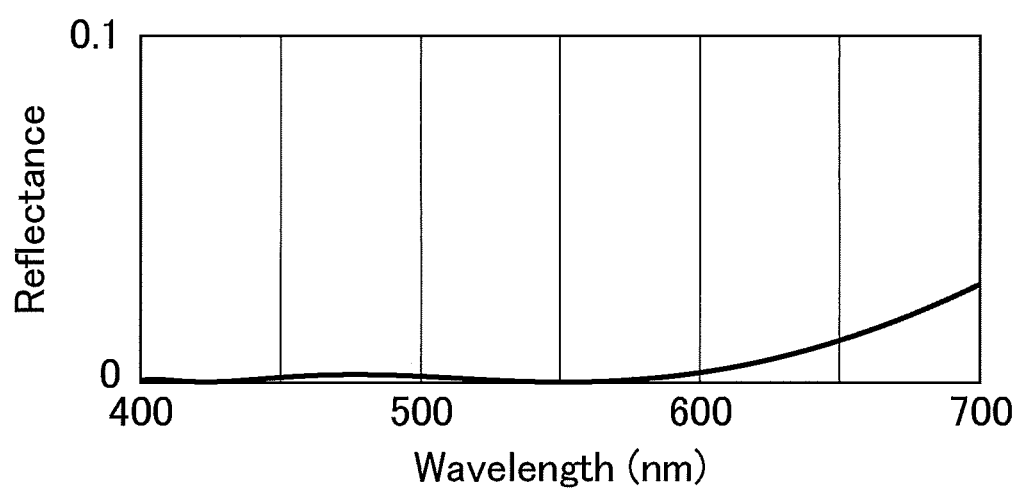
FIG. 19A is a graph showing the reflection spectrum of the circularly polarizing plate of Comparative Example 2.
Figure 19B:
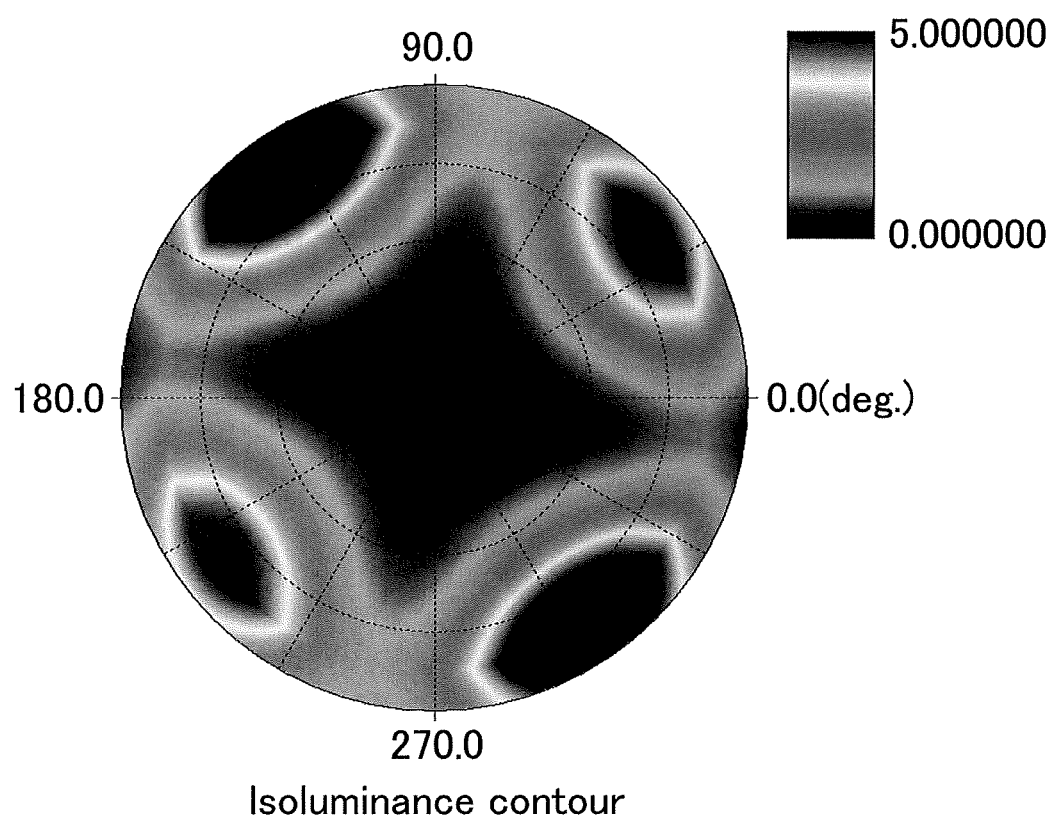
FIG. 19B is an isoluminance contour showing the reflection viewing angle of the circularly polarizing plate of Comparative Example 2.

The reflection spectrum in FIG. 19A shows that the circularly polarizing plate of Comparative Example 2 exhibits the anti-reflection function in a wide range, and the isoluminance contour showing the reflection viewing angle in FIG. 19B shows that the circularly polarizing plate has a wide viewing angle. Yet, the circularly polarizing plate of Comparative Example 2 unfortunately has a thickness as great as 122 μm as shown in Table 1 and can be produced only using expensive reverse dispersion modified PC.

TABLE 1

Figure 10A:
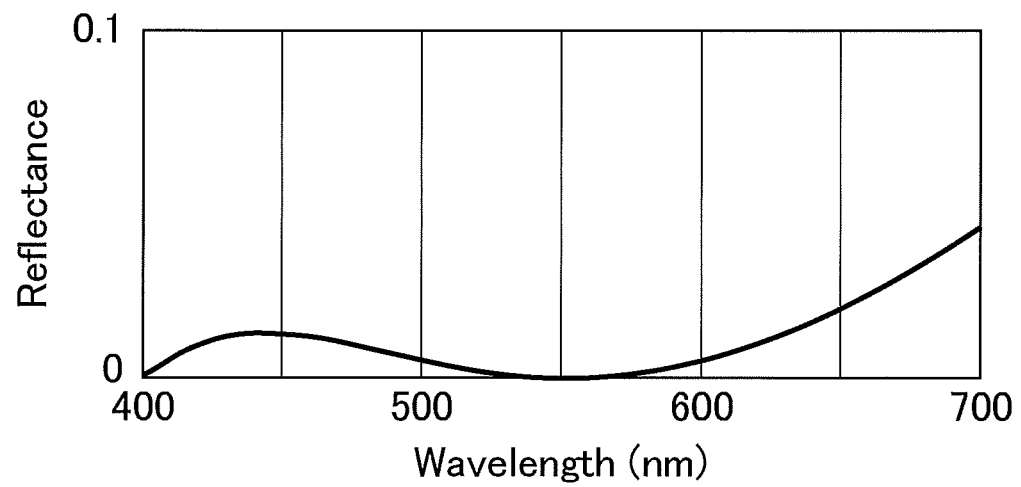
FIG. 10A is a graph showing the reflection spectrum of the circularly polarizing plate of Example 1.
Figure 10B:
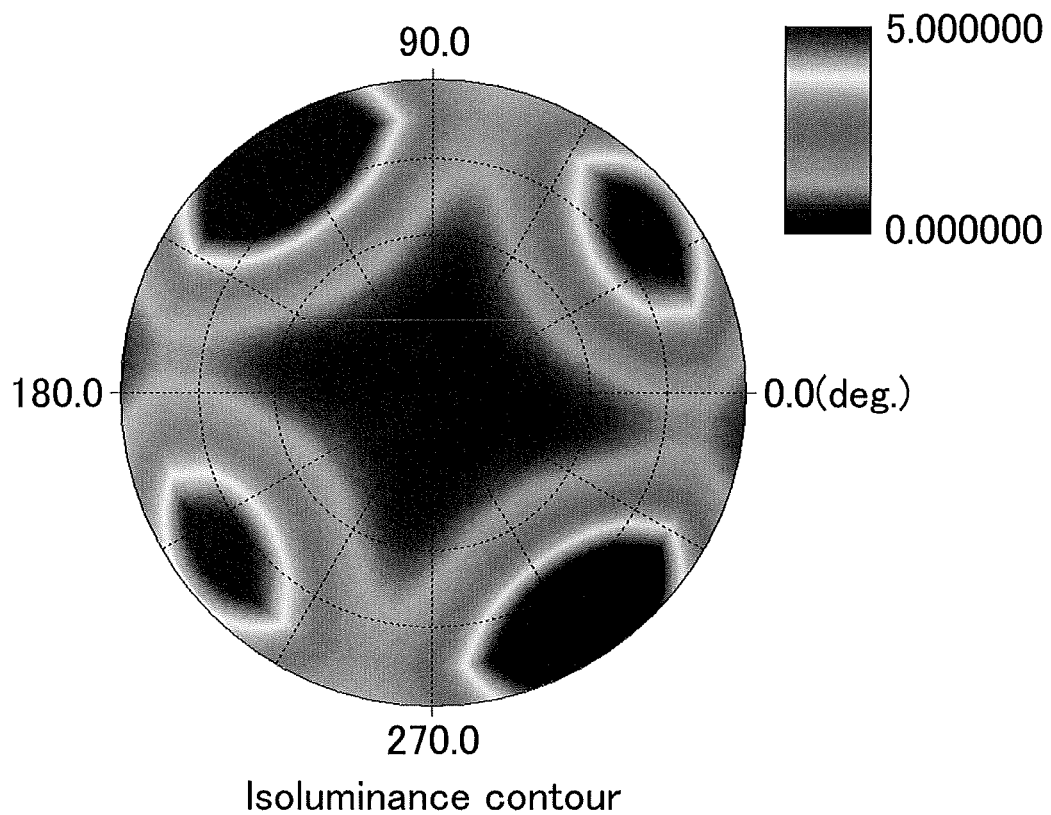
FIG. 10B is an isoluminance contour showing the reflection viewing angle of the circularly polarizing plate of Example 1.
Figure 11A:
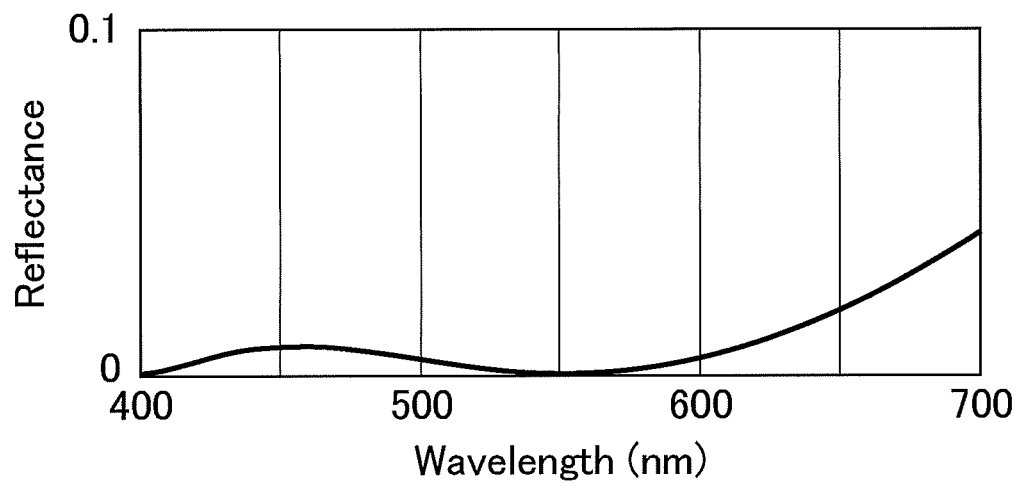
FIG. 11A is a graph showing the reflection spectrum of the circularly polarizing plate of Example 2.
Figure 11B:
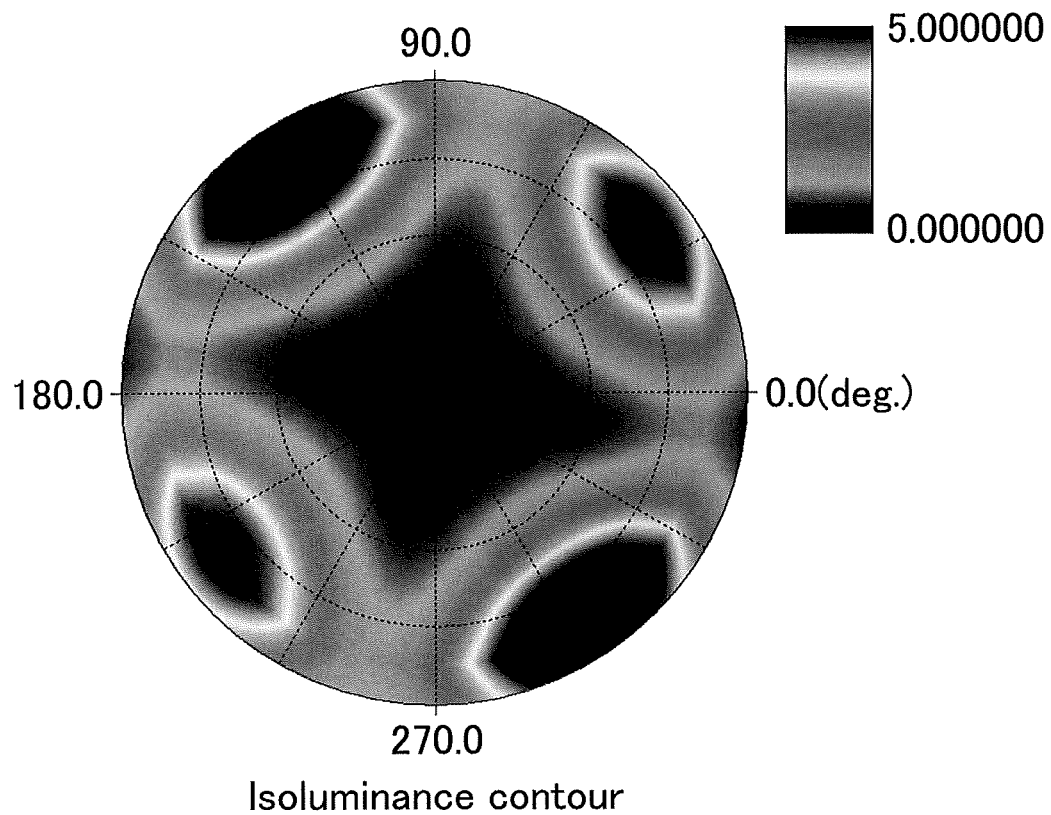
FIG. 11B is an isoluminance contour showing the reflection viewing angle of the circularly polarizing plate of Example 2.
Figure 12A:
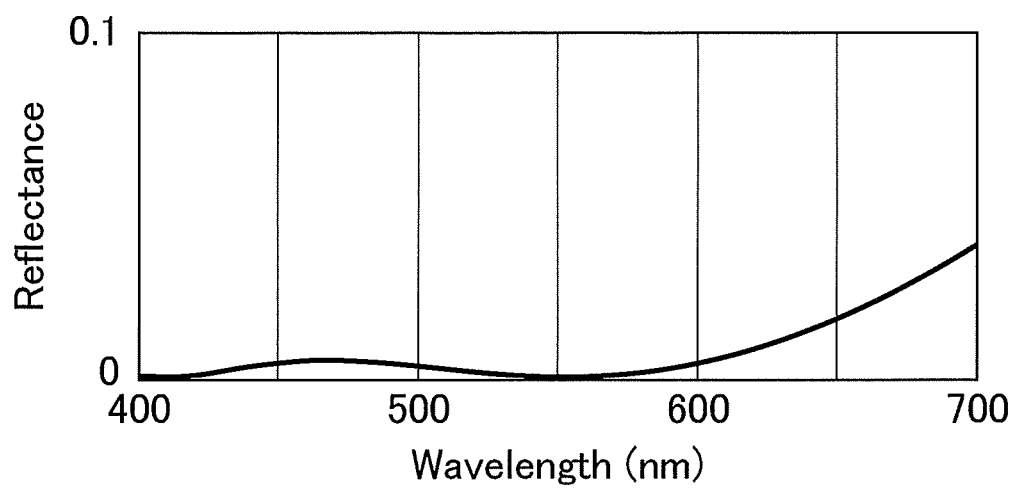
FIG. 12A is a graph showing the reflection spectrum of the circularly polarizing plate of Example 3.
Figure 12B:
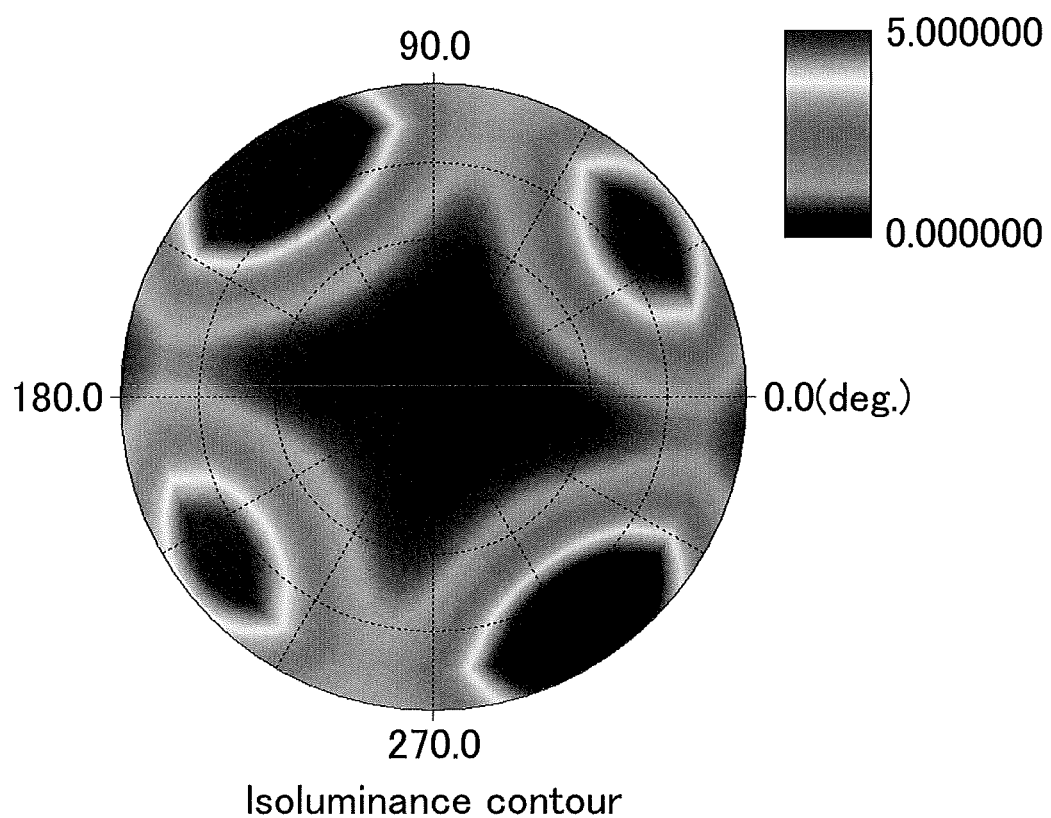
FIG. 12B is an isoluminance contour showing the reflection viewing angle of the circularly polarizing plate of Example 3.
Figure 13A:
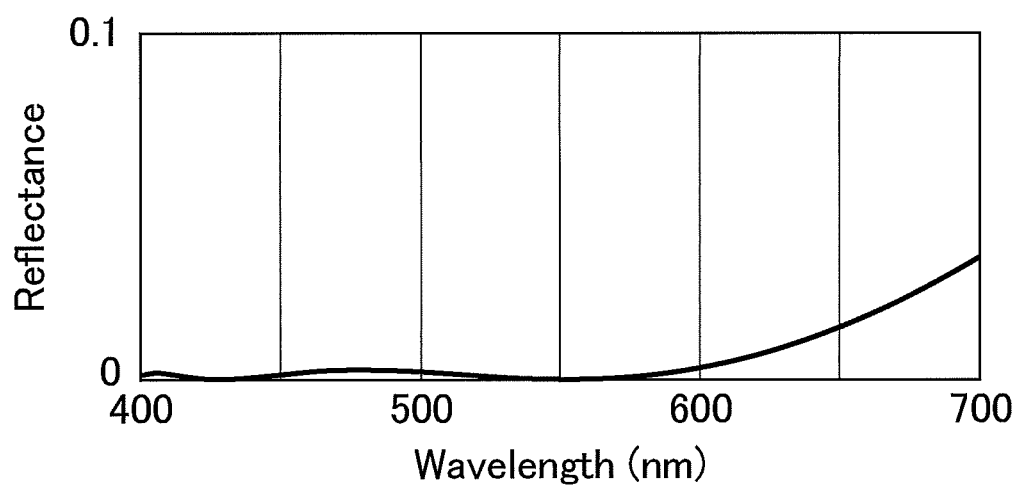
FIG. 13A is a graph showing the reflection spectrum of the circularly polarizing plate of Example 4.
Figure 13B:
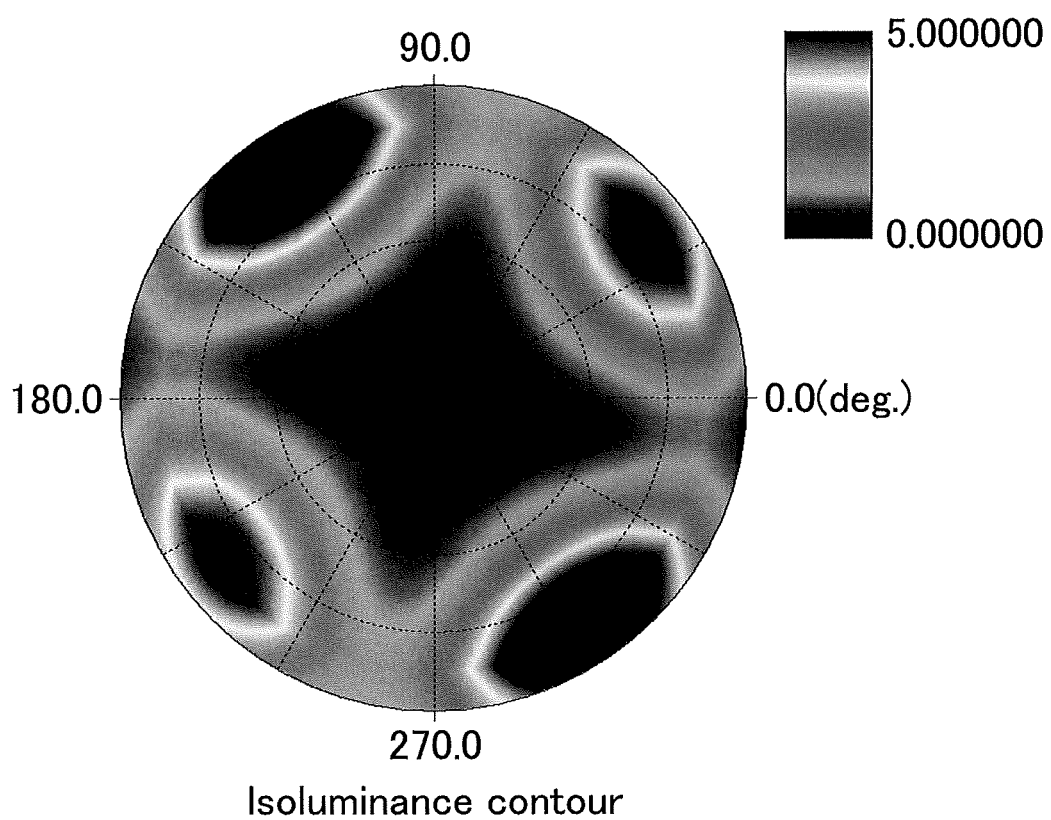
FIG. 13B is an isoluminance contour showing the reflection viewing angle of the circularly polarizing plate of Example 4.
Figure 15A:
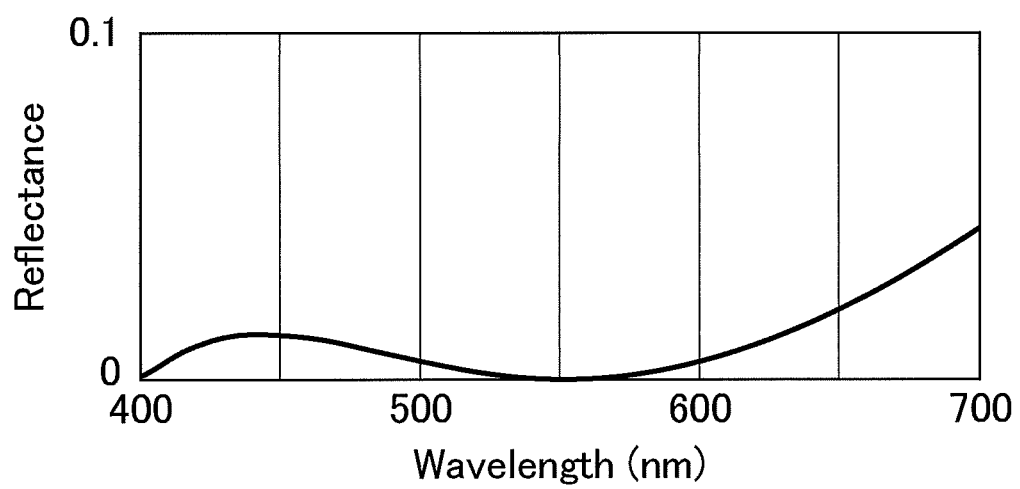
FIG. 15A is a graph showing the reflection spectrum of the circularly polarizing plate of Example 5.
Figure 15B:
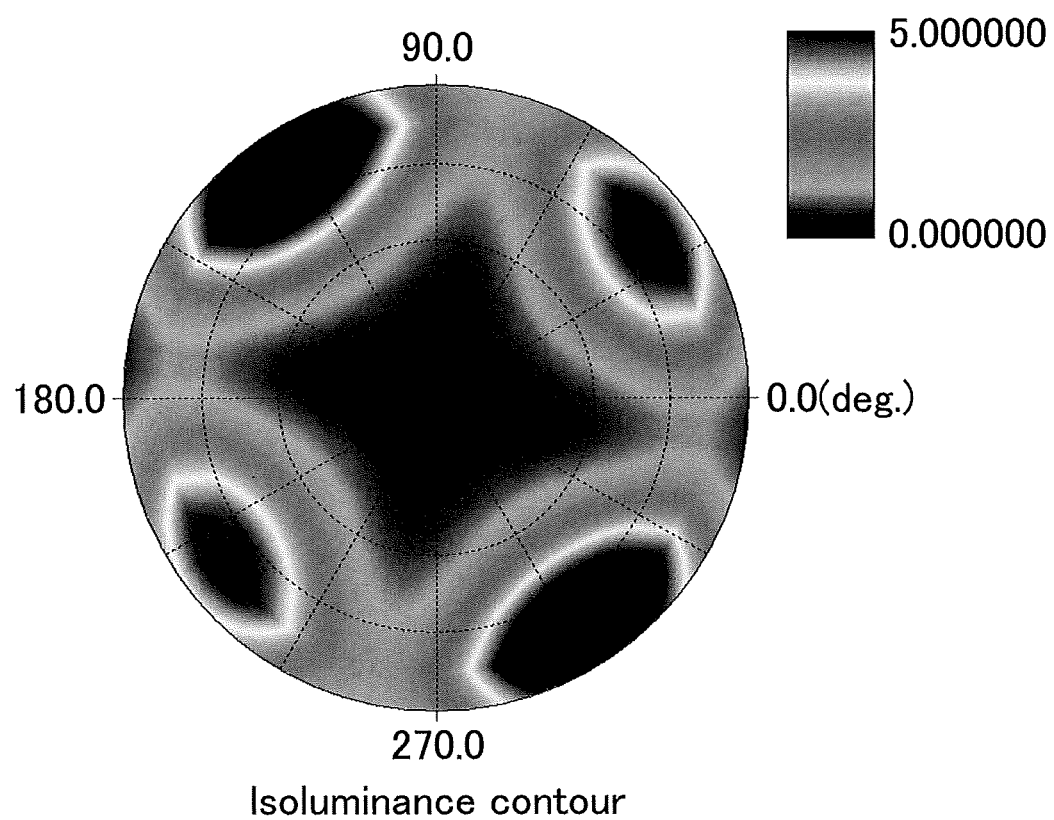
FIG. 15B is an isoluminance contour showing the reflection viewing angle of the circularly polarizing plate of Example 5.
Figure 16A:
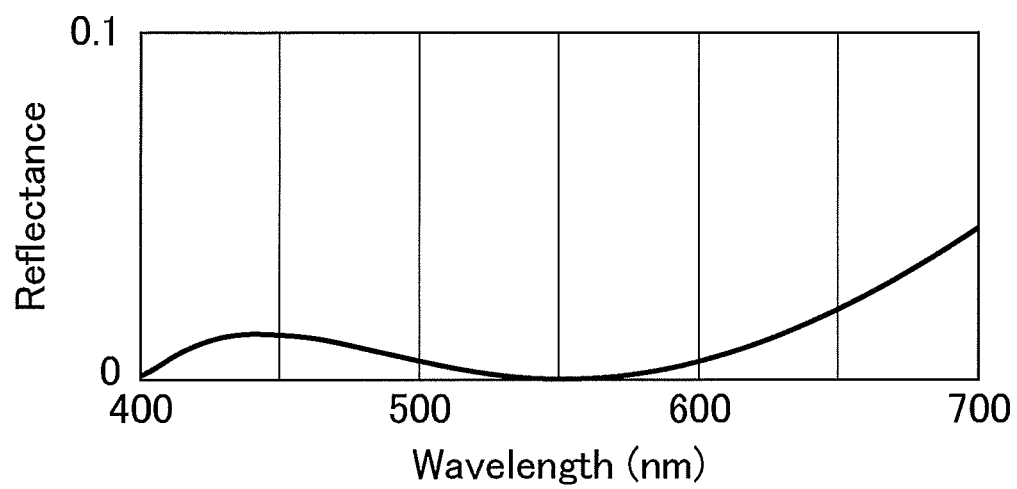
FIG. 16A is a graph showing the reflection spectrum of the circularly polarizing plate of Example 6.
Figure 16B:
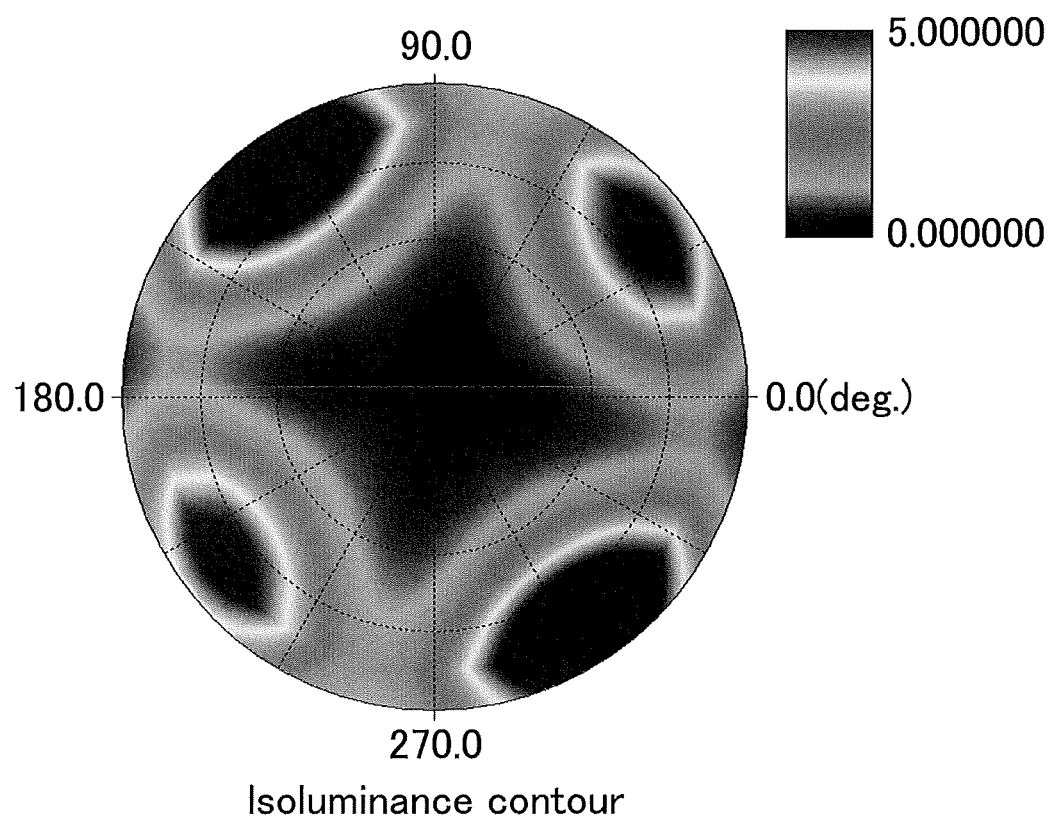
FIG. 16B is an isoluminance contour showing the reflection viewing angle of the circularly polarizing plate of Example 6.

| | | Example 1 | Example 2 | Example 3 | Example 4 | Example 5 | Example 6 |
|---|---|---|---|---|---|---|---|
| Retardation layer A | Material | Polymerizable liquid crystals | Polymerizable liquid crystals | Polymerizable liquid crystals | Polymerizable liquid crystals | Polymerizable liquid crystals having photoreactive group | Polymerizable liquid crystals |
| | Birefringence anisotropy | Negative | Negative | Negative | Negative | Negative | Positive |
| | R550 (nm) | 137.5 | 162.5 | 187.5 | 212.5 | 137.5 | 275 |
| | R450/R550 | 1.18 | 1.18 | 1.18 | 1.18 | 1.18 | 1.05 |
| | R650/R550 | 0.93 | 0.93 | 0.93 | 0.93 | 0.93 | 0.97 |
| Retardation layer B | Material | Polymerizable liquid crystals | Polymerizable liquid crystals | Polymerizable liquid crystals | Polymerizable liquid crystals | Polymerizable liquid crystals | Polymerizable liquid crystals having photoreactive group |
| | Birefringence anisotropy | Positive | Positive | Positive | Positive | Positive | Negative |
| | R550 (nm) | 275 | 300 | 325 | 350 | 275 | 137.5 |
| | R450/R550 | 1.05 | 1.05 | 1.05 | 1.05 | 1.05 | 1.18 |
| | R650/R550 | 0.97 | 0.97 | 0.97 | 0.97 | 0.97 | 0.93 |
| Thickness of circular polarizing plate (μm) | | 80 | 80 | 80 | 82 | 80 | 80 |
| Reflection spectrum | | FIG. 10A | FIG. 11A | FIG. 12A | FIG. 13A | FIG. 15A | FIG. 16A |
| Reflection viewing angle | | FIG. 10B | FIG. 11B | FIG. 12B | FIG. 13B | FIG. 15B | FIG. 16B |

Figure 17A:
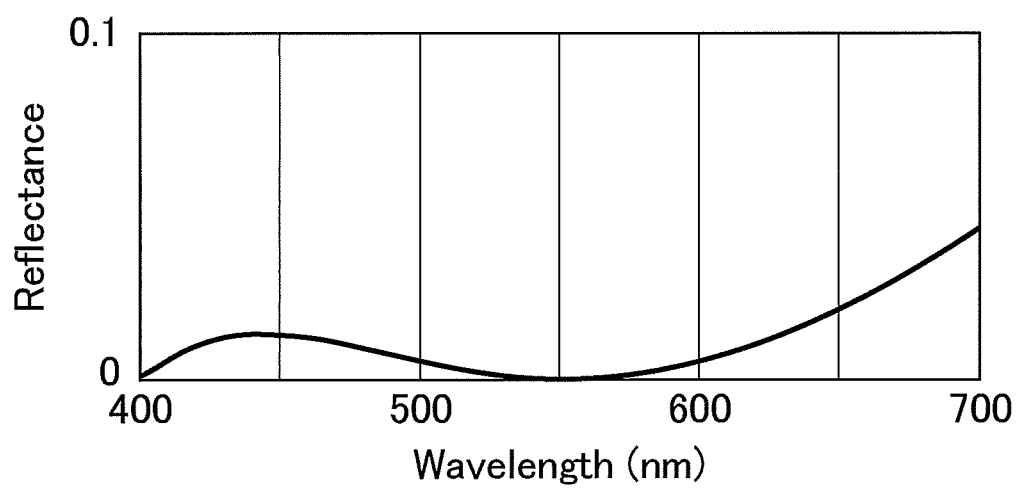
FIG. 17A is a graph showing the reflection spectrum of the circularly polarizing plate of Example 7.
Figure 17B:
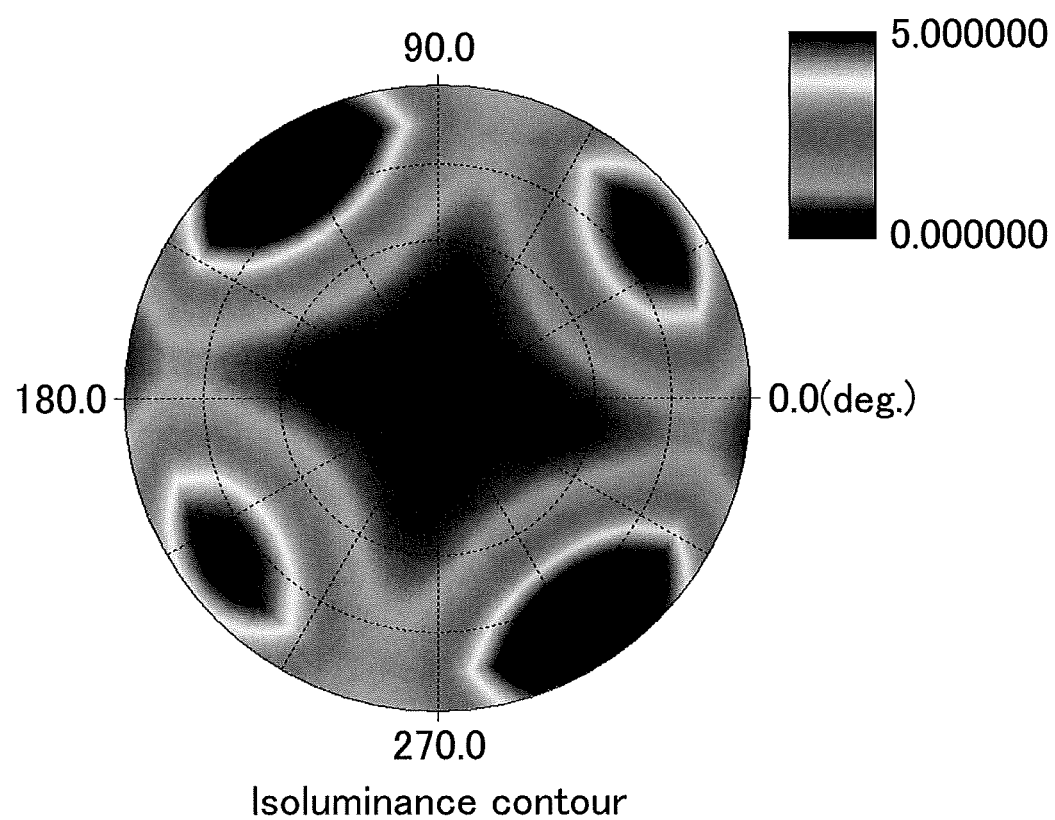
FIG. 17B is an isoluminance contour showing the reflection viewing angle of the circularly polarizing plate of Example 7.
Figure 20A:
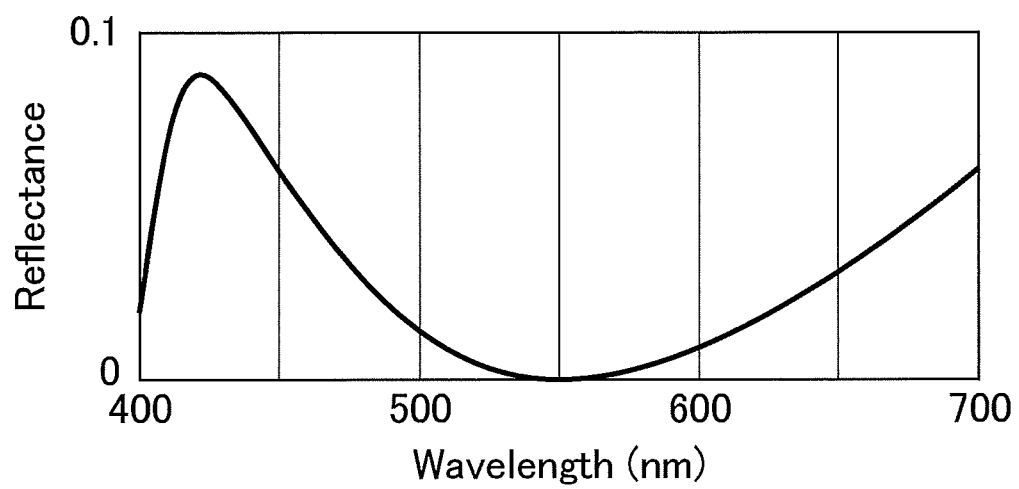
FIG. 20A is a graph showing the reflection spectrum of the circularly polarizing plate of Comparative Example 3.
Figure 20B:
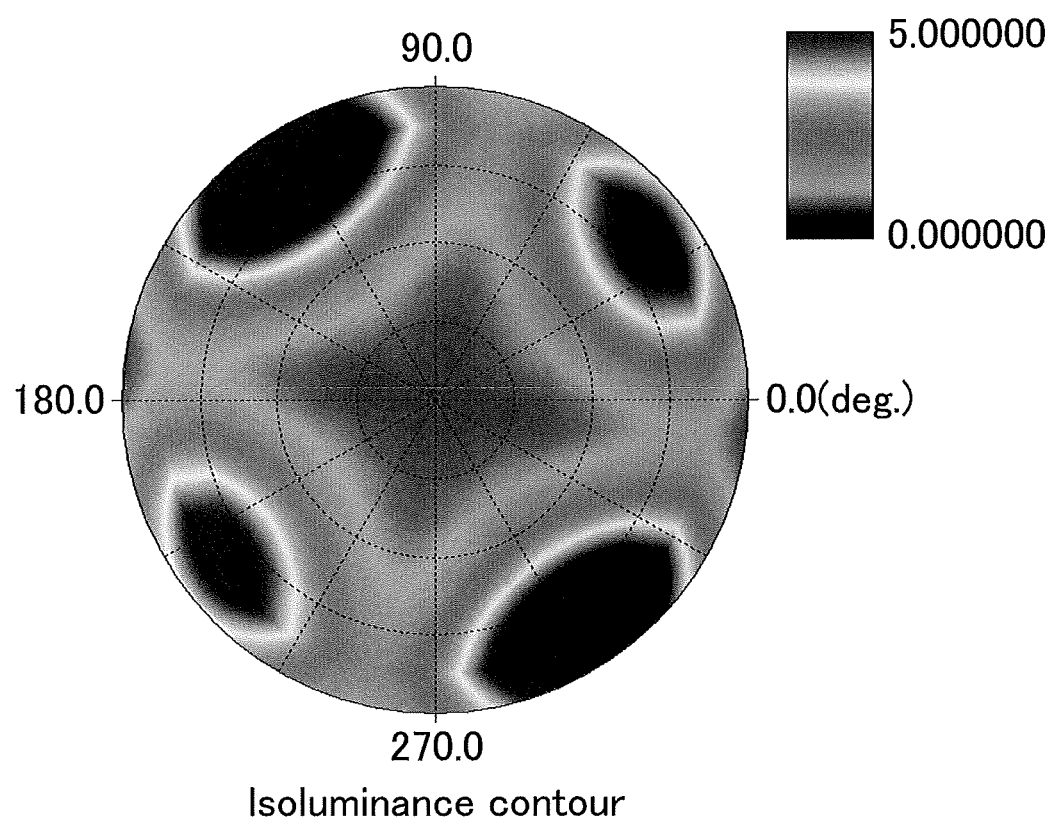
FIG. 20B is an isoluminance contour showing the reflection viewing angle of the circularly polarizing plate of Comparative Example 3.
Figure 21A:
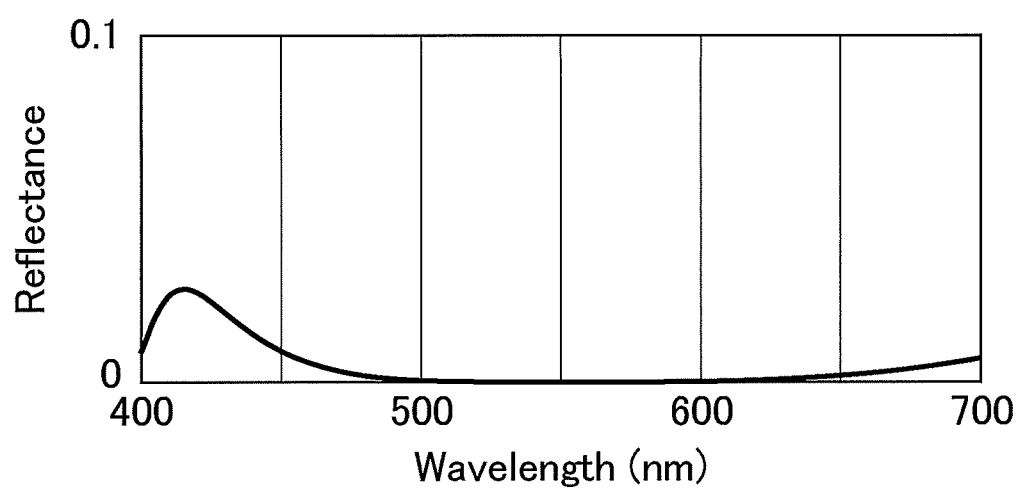
FIG. 21A is a graph showing the reflection spectrum of the circularly polarizing plate of Comparative Example 4.
Figure 21B:
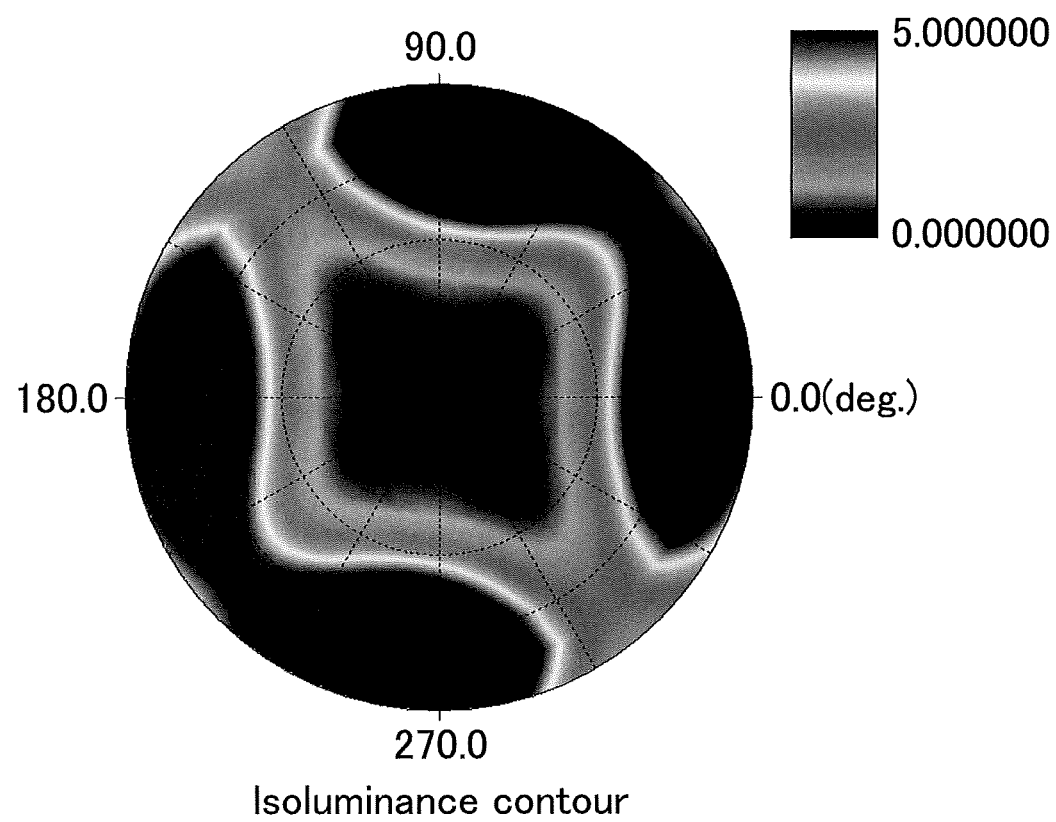
FIG. 21B is an isoluminance contour showing the reflection viewing angle of the circularly polarizing plate of Comparative Example 4.
Figure 22:
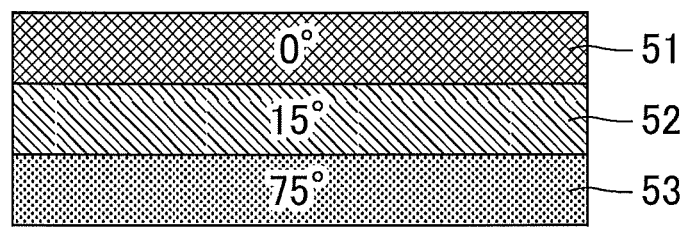
FIG. 22 is a schematic cross-sectional view showing the structure of a conventional circularly polarizing plate.
Figure 23:
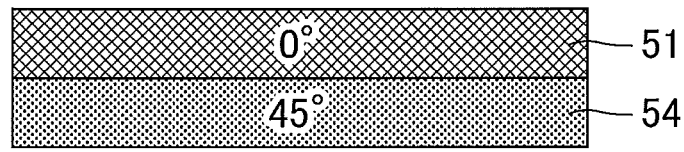
FIG. 23 is a schematic cross-sectional view showing the structure of another conventional circularly polarizing plate.

| | | Example 7 | Comparative Example 1 | Comparative Example 2 | Comparative Example 3 | Comparative Example 4 |
|---|---|---|---|---|---|---|
| Retardation layer A | Material | Polymerizable liquid crystals having photoreactive group | PC | Reverse dispersion modified PC | Polymerizable liquid crystals | Polymerizable liquid crystals |
| | Birefringence anisotropy | Negative | Positive | Positive | Positive | Positive |
| | R550 (nm) | 137.5 | 275 | 137.5 | 137.5 | 275 |
| | R450/R550 | 1.18 | 1.05 | 0.85 | 1.05 | 1.05 |
| | R650/R550 | 0.93 | 0.97 | 1.05 | 0.97 | 0.97 |
| Retardation layer B | Material | Polymerizable liquid crystals | PC | — | — | Polymerizable liquid crystals |
| | Birefringence anisotropy | Positive | Positive | — | — | Positive |
| | R550 (nm) | 275 | 137.5 | — | — | 137.5 |
| | R450/R550 | 1.05 | 1.05 | — | — | 1.05 |
| | R650/R550 | 0.97 | 0.97 | — | — | 0.97 |
| Thickness of circular polarizing plate (μm) | | 68 | 174 | 122 | 78 | 80 |
| Reflection spectrum | | FIG. 17A | FIG. 18A | FIG. 19A | FIG. 20A | FIG. 21A |
| Reflection viewing angle | | FIG. 17B | FIG. 18B | FIG. 19B | FIG. 20B | FIG. 21B |

<Evaluation>

The reflection spectrum and reflection viewing angle of each of the circularly polarizing plates of the examples and the comparative examples were calculated assuming that the circularly polarizing plate was placed on an ideal mirror surface. For the calculations, a liquid crystal simulator (LCD Master) from Shintec Inc. was used. The surface reflection The circularly polarizing plate of Comparative Example 3 has a thickness as small as 78 μm as shown in Table 1. Also, the isoluminance contour showing the reflection viewing angle in FIG. 20B shows that the circularly polarizing plate has a wide viewing angle, while the reflection spectrum in FIG. 20A shows that the circularly polarizing plate can exhibit anti-reflection function in a narrow wavelength range.

The circularly polarizing plate of Comparative Example 4 has a thickness as small as 80 μm as shown in Table 1. Also, the reflection spectrum in FIG. 21A shows that the circularly polarizing plate exhibits the anti-reflection function in a wide range, while the isoluminance contour showing the reflection viewing angle in FIG. 21B shows that the circularly polarizing plate has a narrow viewing angle.

Figure 14:
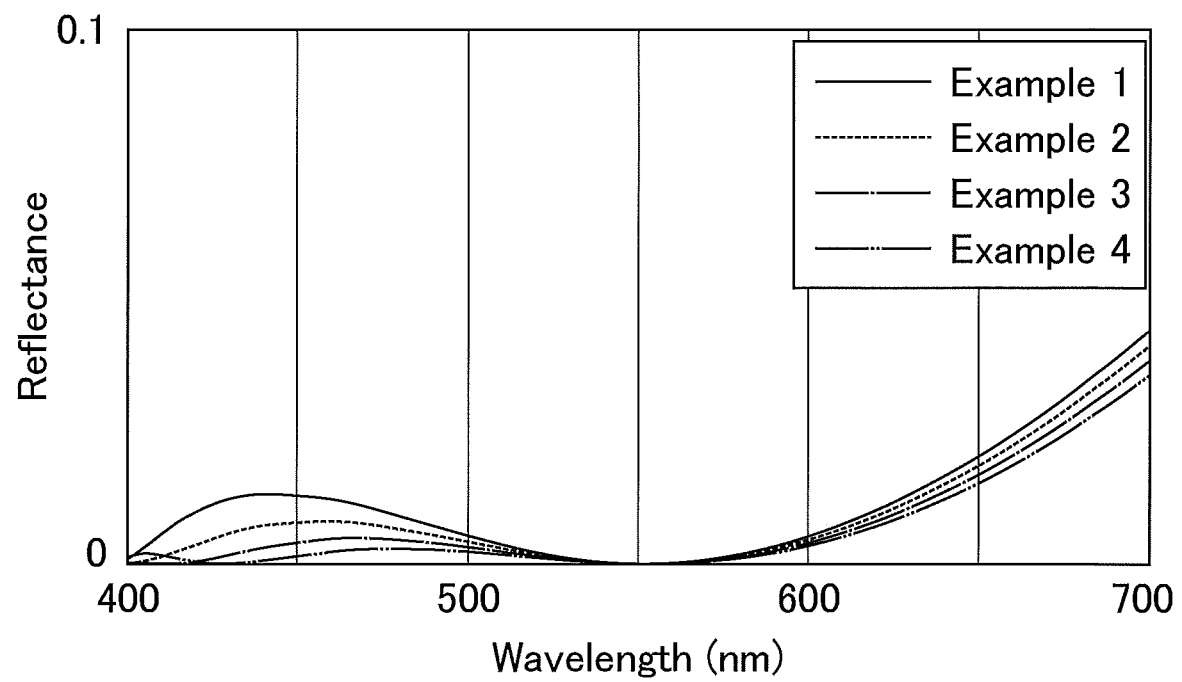
FIG. 14 is a graph comparing the reflection spectra of the circularly polarizing plates of Examples 1 to 4.

In contrast, the circularly polarizing plates of Examples 1 to 4 have a thickness of 80 to 82 μm as shown in Table 1, achieving reduction in thickness. Also, the reflection spectra in FIGS. 10A, 11A, 12A, and 13A show that the circularly polarizing plates exhibit the anti-reflection function in a wide wavelength range from 400 to 700 nm. This means that the multilayer retarders in the circularly polarizing plates provide a retardation of λ/4 in a wide range. Moreover, the isoluminance contours showing the reflection viewing angles in FIGS. 10B, 11B, 12B, and 13B show that the circularly polarizing plates have a wide viewing angle. The circularly polarizing plates of Examples 1 to 4 are different only in the retardation values of the retardation layer (A) 112 and the retardation layer (B) 114. FIG. 14 is a graph comparing the reflection spectra of the circularly polarizing plates of Examples 1 to 4. FIG. 14 shows that the reflectances in a shorter wavelength range are in the relationship of Example 1>Example 2>Example 3>Example 4. This shows that adjusting the retardation values of the retardation layer (A) 112 and the retardation layer (B) 114 enables adjustment of the reverse wavelength dispersion.

The circularly polarizing plates of Examples 5 to 7 are different from the circularly polarizing plates of Examples 1 to 4 in that the circularly polarizing plates of Examples 5 to 7 lack the adhesives 105 and 106 or the alignment films 107 and 108 and have a thickness of 68 to 80 μm as shown in Table 1, achieving reduction in thickness and simplification of the structure. Also, the reflection spectra in FIGS. 15A, 16A, and 17A show that the circularly polarizing plates exhibit the anti-reflection function in a wide wavelength range from 400 to 700 nm. Moreover, the isoluminance contours showing the reflection viewing angles in FIGS. 15B, 16B, and 17B show that the circularly polarizing plates have a wide viewing angle.

[Additional Remarks]

One aspect of the present invention is directed to a circularly polarizing plate including: a first retardation layer having negative refractive index anisotropy; a second retardation layer having positive refractive index anisotropy; and a linear polarizer, the first retardation layer and the second retardation layer being disposed such that their optical axes are parallel to each other, the first retardation layer providing an in-plane retardation whose absolute value is $|R1(\lambda)|$ to light having a wavelength of λ nm, the second retardation layer providing an in-plane retardation whose absolute value is $\lambda R2(\lambda)|$ to light having a wavelength of λ nm, the first retardation layer and the second retardation layer satisfying the following formulas (1) to (4):

$$|R1(450)|>|R1(550)|>|R1(650)| \tag{1}$$

$$|R2(550)|>|R1(550)| \tag{2}$$

$$|R2(550)|-|R1(550)|>|R2(450)|-|R1(450)| \tag{3}$$

$$|R2(650)|-|R1(650)|>|R2(550)|-|R1(550)| \tag{4}$$

The first retardation layer preferably provides an in-plane retardation whose absolute value is 115 to 220 nm to light having a wavelength of 550 nm. The second retardation layer preferably provides an in-plane retardation whose absolute value is 255 to 355 nm to light having a wavelength of 550 nm. At least one of the first retardation layer or the second retardation layer may contain a cured product of a polymerizable liquid crystal.

Another aspect of the present invention is directed to a display device including a display panel, and the circularly polarizing plate disposed on a viewing surface side of the display panel.

The display panel may be an organic electroluminescent panel or may be a liquid crystal panel.

Yet another aspect of the present invention is directed to a multilayer retarder including a first retardation layer having negative refractive index anisotropy, and a second retardation layer having positive refractive index anisotropy, the first retardation layer and the second retardation layer being disposed such that their optical axes are parallel to each other, the first retardation layer providing an in-plane retardation whose absolute value is $|R1(\lambda)|$ to light having a wavelength of λ nm, the second retardation layer providing an in-plane retardation whose absolute value is $|R2(\lambda)|$ to light having a wavelength of λ nm, the first retardation layer and the second retardation layer satisfying the following formulas (1) to (4):

$$|R1(450)|>|R1(550)|>|R1(650)| \tag{1}$$

$$|R2(550)|>|R1(550)| \tag{2}$$

$$|R2(550)|-|R1(550)|>|R2(450)|-|R1(450)| \tag{3}$$

$$|R2(650)|-|R1(650)|>|R2(550)|-|R1(550)| \tag{4}$$

What is claimed is:

1. A circularly polarizing plate comprising:
a first retardation layer having negative refractive index anisotropy;
a second retardation layer having positive refractive index anisotropy; and
a linear polarizer,
the first retardation layer and the second retardation layer being disposed such that their optical axes are parallel to each other,
the first retardation layer providing an in-plane retardation whose absolute value is $|R1(\lambda)|$ to light having a wavelength of λ nm,
the second retardation layer providing an in-plane retardation whose absolute value is $\lambda R2(\lambda)|$ to light having a wavelength of λ nm,
the first retardation layer and the second retardation layer satisfying the following formulas (1) to (4):

$$|R1(450)|>|R1(550)|>|R1(650)| \tag{1}$$

$$|R2(550)|>|R1(550)| \tag{2}$$

$$|R2(550)|-|R1(550)|>|R2(450)|-|R1(450)| \tag{3}$$

$$|R2(650)|-|R1(650)|>|R2(550)|-|R1(550)| \tag{4}$$

2. The circularly polarizing plate according to claim 1, wherein the first retardation layer provides an in-plane retardation whose absolute value is 115 to 220 nm to light having a wavelength of 550 nm.

3. The circularly polarizing plate according to claim 1, wherein the second retardation layer provides an in-plane retardation whose absolute value is 255 to 355 nm to light having a wavelength of 550 nm.

4. The circularly polarizing plate according to claim 1, wherein at least one of the first retardation layer or the second retardation layer contains a cured product of a polymerizable liquid crystal.

5. A display device comprising
a display panel, and
the circularly polarizing plate according to claim 1 disposed on a viewing surface side of the display panel.

6. The display device according to claim 5, wherein the display panel is an organic electroluminescent panel.

7. The display device according to claim 5, wherein the display panel is a liquid crystal panel.

8. A multilayer retarder comprising
a first retardation layer having negative refractive index anisotropy, and
a second retardation layer having positive refractive index anisotropy,
the first retardation layer and the second retardation layer being disposed such that their optical axes are parallel to each other,
the first retardation layer providing an in-plane retardation whose absolute value is $|R1(\lambda)|$ to light having a wavelength of $\lambda$ nm,
the second retardation layer providing an in-plane retardation whose absolute value is $|R2(\lambda)|$ to light having a wavelength of $\lambda$ nm,
the first retardation layer and the second retardation layer satisfying the following formulas (1) to (4):

$$|R1(450)| > |R1(550)| > |R1(650)| \tag{1}$$

$$|R2(550)| > |R1(550)| \tag{2}$$

$$|R2(550)| - |R1(550)| > |R2(450)| - |R1(450)| \tag{3}$$

$$|R2(650)| - |R1(650)| > |R2(550)| - |R1(550)| \tag{4}$$

\* \* \* \* \*